United States Patent
Lee et al.

(10) Patent No.: US 11,895,857 B2
(45) Date of Patent: Feb. 6, 2024

(54) ORGANIC LIGHT EMITTING ELEMENT

(71) Applicant: Samsung Display Co., Ltd., Yongin-si (KR)

(72) Inventors: Bora Lee, Hwaseong-si (KR); Hyomin Ko, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 504 days.

(21) Appl. No.: 17/212,529

(22) Filed: Mar. 25, 2021

(65) Prior Publication Data

US 2022/0029122 A1 Jan. 27, 2022

(30) Foreign Application Priority Data

Jul. 22, 2020 (KR) .......................... 10-2020-0090885

(51) Int. Cl.
*H10K 50/15* (2023.01)
*H10K 85/60* (2023.01)
(Continued)

(52) U.S. Cl.
CPC ......... *H10K 50/156* (2023.02); *H10K 85/624* (2023.02); *H10K 85/633* (2023.02);
(Continued)

(58) Field of Classification Search
CPC .. H10K 50/156; H10K 85/624; H10K 85/633; H10K 85/6572; H10K 50/11; H10K 50/16; H10K 50/18; H10K 50/858
See application file for complete search history.

(56) References Cited

U.S. PATENT DOCUMENTS 8,471,463 B2   6/2013  Sumida et al.
8,530,888 B2   9/2013  Jeong et al.
(Continued)

FOREIGN PATENT DOCUMENTS

KR    10-1084197       11/2011
KR    10-2013-0099098   9/2013
(Continued)

OTHER PUBLICATIONS

Third Party Observation for European Patent Application No. 20210152336 (6 pages).

(Continued)

*Primary Examiner* — S M Sohel Imtiaz
(74) *Attorney, Agent, or Firm* — KILE PARK REED & HOUTTEMAN PLLC

(57) ABSTRACT

An organic light emitting element includes a first electrode, a hole transport region disposed on the first electrode, an emission layer disposed on the hole transport region, an electron transport region disposed on the emission layer and including an electron transport layer, and a second electrode disposed on the electron transport region. The hole transport region may include a first hole transport layer having a first refractive index, a second hole transport layer disposed on the first hole transport layer and having a second refractive index less than the first refractive index, and a third hole transport layer disposed below the first hole transport layer and having a third refractive index less than the first refractive index. A difference between the first refractive index and the second refractive index, and a difference between the first refractive index and the third refractive index may each be about 0.1 to about 1.0.

20 Claims, 4 Drawing Sheets

(51) Int. Cl.
  *H10K 50/11*    (2023.01)
  *H10K 50/16*    (2023.01)
  *H10K 50/18*    (2023.01)
(52) U.S. Cl.
  CPC ......... *H10K 85/6572* (2023.02); *H10K 50/11* (2023.02); *H10K 50/16* (2023.02); *H10K 50/18* (2023.02)

(56) References Cited

U.S. PATENT DOCUMENTS

| | | | |
|---|---|---|---|
| 8,963,143 | B2 | 2/2015 | Loebl et al. |
| 9,312,495 | B2 | 4/2016 | Pflumm et al. |
| 10,193,094 | B2 | 1/2019 | Stoessel et al. |
| 10,756,275 | B2 | 8/2020 | Kato et al. |
| 10,840,455 | B1 * | 11/2020 | Mun .................... H10K 85/633 |
| 2013/0207046 | A1 † | 8/2013 | Pflumm |
| 2016/0035992 | A1 † | 2/2016 | Stoessel |
| 2016/0043317 | A1 * | 2/2016 | Takada ................ H10K 50/156 257/40 |
| 2016/0197277 | A1 * | 7/2016 | Kato .................... C07D 333/76 548/440 |
| 2018/0331290 | A1 * | 11/2018 | Miyake ............... C07D 409/12 |
| 2019/0393426 | A1 * | 12/2019 | Masuda .............. H10K 85/623 |
| 2020/0006710 | A1 * | 1/2020 | Koch .................. H10K 50/155 |
| 2020/0176692 | A1 * | 6/2020 | Watabe ................... G09F 9/30 |
| 2020/0185623 | A1 * | 6/2020 | Lin ........................ H10K 85/40 |
| 2021/0217981 | A1 * | 7/2021 | Tanaka ................. H10K 71/16 |
| 2021/0234098 | A1 | 7/2021 | Lee et al. |
| 2021/0280831 | A1 | 9/2021 | Lee et al. |
| 2022/0119360 | A1 * | 4/2022 | Mochizuki .......... C07D 263/62 |

FOREIGN PATENT DOCUMENTS

| | | |
|---|---|---|
| KR | 10-1496789 | 2/2015 |
| KR | 10-2015-0140356 | 12/2015 |
| KR | 10-2017-0030450 | 3/2017 |
| KR | 10-1871289 | 8/2018 |
| KR | 10-2019-0111948 | 10/2019 |
| KR | 10-2021-0095026 | 7/2021 |
| KR | 10-2021-0111941 | 9/2021 |
| TW | I660535 B * | 5/2019 |
| WO | 2012034627 † | 3/2012 |
| WO | 2014166572 † | 10/2014 |

OTHER PUBLICATIONS

Third Party Observation for European Patent Application No. 20210152336 (5 pages).
Third Party Observation for application No. EP20210152336.†

\* cited by examiner
† cited by third party

ORGANIC LIGHT EMITTING ELEMENT

CROSS-REFERENCE TO RELATED APPLICATION(S)

This application claims priority to and benefits of Korean Patent Application No. 10-2020-0090885 under 35 U.S.C. § 119, filed on Jul. 22, 2020 in the Korean Intellectual Property Office, the entire contents of which are incorporated herein by reference.

BACKGROUND

1. Technical Field

The disclosure relates to an organic light emitting element including hole transport layers having different refractive indices.

2. Description of the Related Art

Development continues for various types of display devices used in multimedia devices such as a television set, a mobile phone, a tablet computer, a navigation system, and a game console. In such display devices, a so-called self-luminescent display element implements display through the use of a light emitting material including organic compounds or quantum dots in an emission layer disposed between electrodes facing each other to emit light.

In the application of a light emitting element in a display device, there is a continuous demand for a light emitting element having high light emission efficiency, and for the development of materials and structures for a light emitting element that is capable of stably attaining such characteristics.

SUMMARY

The disclosure provides an organic light emitting element exhibiting excellent light emission efficiency.

An embodiment of the inventive concept provides an organic light emitting element including a first electrode, a hole transport region disposed on the first electrode, an emission layer disposed on the hole transport region, an electron transport region disposed on the emission layer and including an electron transport layer, and a second electrode disposed on the electron transport region. The hole transport region may include a first hole transport layer having a first refractive index, a second hole transport layer disposed above the first hole transport layer and having a second refractive index less than the first refractive index, and a third hole transport layer disposed below the first hole transport layer and having a third refractive index less than the first refractive index. A difference between the first refractive index and the second refractive index may be in a range of about 0.1 to about 1.0, and a difference between the first refractive index and third refractive index may be in a range of about 0.1 to about 1.0.

The hole transport region may further include an electron blocking layer disposed between the second hole transport layer and the emission layer, wherein the electron blocking layer may have a refractive index greater than the refractive index of the emission layer and greater than the second refractive index.

A thickness of the second hole transport layer and a thickness of the third hole transport layer may each be in a range of about 30% to about 40% of a total thickness of the first to third hole transport layers.

A thickness ratio of the second hole transport layer, the first hole transport layer, and the third hole transport layer may be in a range of about 3:4:3 to about 4:2:4.

A thickness of the second hole transport layer and a thickness of the third hole transport layer may each be in a range of about 10 nm to about 100 nm.

The second refractive index and the third refractive index may each be in a range of about 1.2 to about 1.7.

The first refractive index may be in a range of about 1.7 to about 2.2.

The third hole transport layer may be directly disposed on the first electrode, and the third refractive index and the refractive index of the emission layer may be the same.

The second hole transport layer and the third hole transport layer may each independently include an aromatic compound represented by one of Formulas 1 to 4 below.

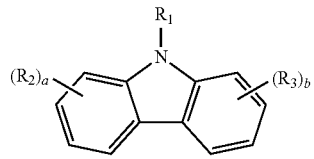

[Formula 1]

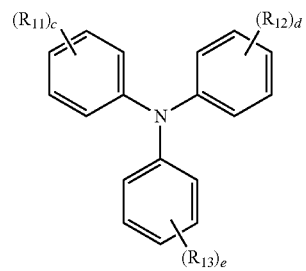

[Formula 2]

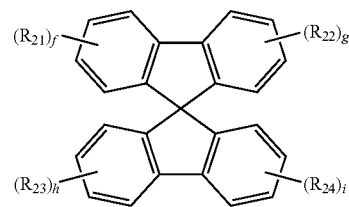

[Formula 3]

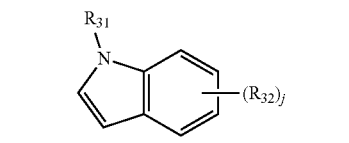

[Formula 4]

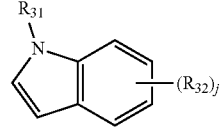

In Formulas 1 to 4 above, a, b, and f to j are each independently an integer from 1 to 4, c to e are each independently an integer from 1 to 5, $R_1$ to $R_3$, $R_{11}$ to $R_{13}$, $R_{21}$ to $R_{24}$, $R_{31}$, and $R_{32}$ are each independently a hydrogen atom, a deuterium atom, a halogen atom, a substituted or unsubstituted alkyl group having 1 to 30 carbon atoms, a substituted or unsubstituted cycloalkyl group having 3 to 30 carbon atoms, or a substituted or unsubstituted aryl group having 6 to 30 ring-forming carbon atoms, or bonded to an adjacent group to form a ring, and at least one among $R_1$ to $R_3$, at least one among $R_{11}$ to $R_{13}$, at least one among $R_{21}$ to $R_{24}$, and at least one among $R_{31}$ to $R_{32}$ are each independently a substituted or unsubstituted alkyl group having 1 to 30 carbon atoms, or a substituted or unsubstituted cycloalkyl group having 3 to 30 carbon atoms.

At least one among $R_{11}$ to $R_{13}$ may each be a substituted or unsubstituted alkyl group having 1 to 10 carbon atoms, or a substituted or unsubstituted cycloalkyl group having 3 to 10 carbon atoms.

The emission layer and the electron transport layer may each include the aromatic compound represented by one of Formulas 1 to 4 above.

A refractive index of the emission layer and a refractive index of the electron transport layer may each be less than the first refractive index.

The electron transport region may further include a hole blocking layer disposed on the emission layer, and a refractive index of the emission layer and a refractive index of the electron transport layer may each be less than the refractive index of the hole blocking layer.

A difference between the refractive index of the hole blocking layer and the refractive index of the emission layer may be in a range of about 0.1 to about 1.0, and a difference between the refractive index of the hole blocking layer and the refractive index of the electron transport layer may be in a range of about 0.1 to about 1.0.

The organic light emitting element may further include a hole injection layer disposed between the first electrode and the first hole transport layer, wherein the refractive index of the hole injection layer may be less than the first refractive index.

A refractive index of the emission layer and a refractive index of the electron transport layer may each be in a range of about 1.2 to about 1.7.

In an embodiment of the inventive concept, an organic light emitting element includes a first electrode, hole transport layers disposed on the first electrode, an emission layer disposed on the hole transport layers, a hole blocking layer disposed on the emission layer, an electron transport layer disposed on the hole blocking layer, and a second electrode disposed on the electron transport layer. The hole transport layers may include a first hole transport layer having a first refractive index, a second hole transport layer disposed between the emission layer and the first hole transport layer and having a second refractive index less than the first refractive index, and a third hole transport layer disposed between the first hole transport layer and the first electrode and having a third refractive index less than the first refractive index. The second refractive index, the third refractive index, a refractive index of the emission layer, and a refractive index of the electron transport layer may each be in a range of about 1.2 to about 1.7. The first refractive index and a refractive index of the hole blocking layer may each be in a range of about 1.7 to about 2.2. The second refractive index, the third refractive index, the refractive index of the emission layer, and the refractive index of the electron transport layer may each be less than the first refractive index.

A difference between the first refractive index and the second refractive index may be in a range of about 0.1 to about 1.0, and a difference between the first refractive index and the third refractive index may be in a range of about 0.1 to about 1.0.

The second refractive index, the third refractive index, the refractive index of the emission layer, and the refractive index of the electron transport layer may be the same.

The second hole transport layer, the third hole transport layer, the emission layer, and the electron transport layer may each independently include an aromatic compound represented by one of Formulas 1 to 4 above.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
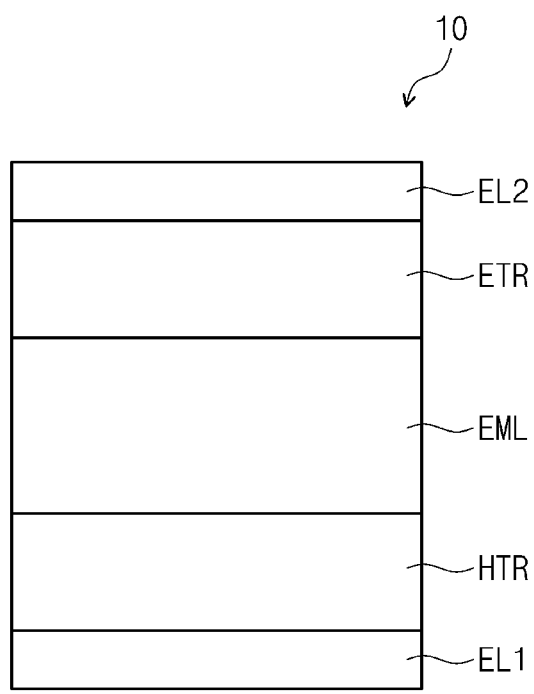
FIG. 1 is a schematic cross-sectional view of an organic light emitting element according to an embodiment.

The present disclosure may be modified in many alternate forms, and thus embodiments will be shown in the drawings and described in detail. It should be understood, however, that it is not intended to limit the inventive concept to the particular forms disclosed, but rather, is intended to cover all modifications, equivalents, and alternatives falling within the spirit and scope of the invention.

In the present description, when an element (or a region, a layer, a portion, etc.) is referred to as being "on," "connected to," or "coupled to" another element, it means that the element may be directly disposed on/connected to/coupled to the other element, or that one or more elements may be disposed therebetween.

Like reference numerals refer to like elements throughout the specification. In the drawings, the thickness, the ratio, and the dimensions of elements may be exaggerated for an effective description of technical contents. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

In addition, terms such as "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, organic light emitting elements according to embodiments of the inventive concept will be described with reference to the accompanying drawings.

Figure 2:
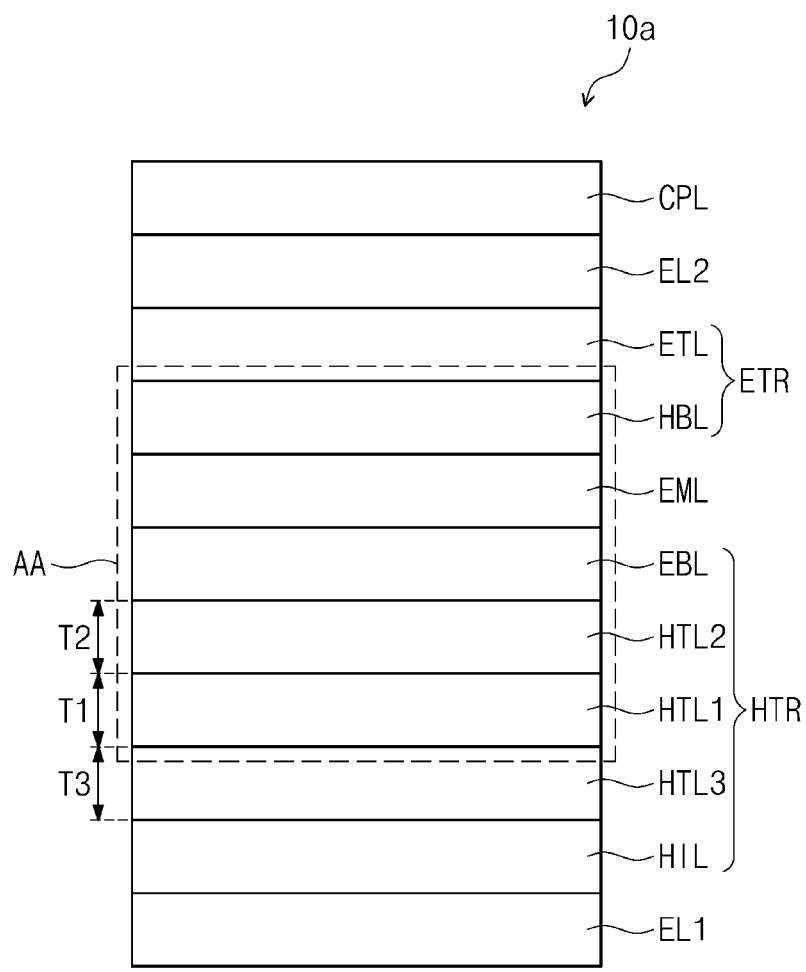
FIG. 2 is a schematic cross-sectional view of an organic light emitting element according to an embodiment.

FIGS. 1 and 2 are schematic cross-sectional views of organic light emitting elements according to embodiments of the inventive concept. Referring to FIGS. 1 and 2, in organic light emitting elements 10 and 10a according to embodiments, a first electrode EL1 and a second electrode EL2 may be disposed to face each other, and a hole transport region HTR, an emission layer EML, and an electron transport region ETR may be disposed between the first electrode EL1 and the second electrode EL2. The organic light emitting element 10a according to an embodiment may further include a capping layer CPL disposed on the second electrode EL2.

Compared to FIG. 1, FIG. 2 illustrates a schematic cross-sectional view of the organic light emitting element 10a of an embodiment, in which the hole transport region HTR includes a hole injection layer HIL, first to third hole transport layers HTL1, HTL2, and HTL3, and an electron blocking layer EBL. FIG. 2 illustrates the organic light emitting element 10a of an embodiment, in which the electron transport region ETR includes a hole blocking layer HBL and an electron transport layer ETL.

The organic light emitting elements 10 and 10a according to embodiments may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The electron transport region ETR may include an electron transport layer ETL. The hole transport region HTR may include first to third hole transport layers HTL1, HTL2, and HTL3.

According to an embodiment, the first hole transport layer HTL1 may have a first refractive index. The second hole transport layer HTL2 may have a second refractive index less than the first refractive index. The third hole transport layer HTL3 may have a third refractive index less than the first refractive index. A difference between the first refractive index and the second refractive index may be in a range of about 0.1 to about 1.0, and a difference between the first refractive index and the third refractive index may be in a range of about 0.1 to about 1.0. The first refractive index may be greater than the second refractive index and may be greater than the third refractive index. The hole transport region HTR will be described in more detail later.

The first electrode EL1 has conductivity. The first electrode EL1 may be formed of a metal alloy or a conductive compound. The first electrode EL1 may be an anode or a cathode. The first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). For example, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. A thickness of the first electrode EL1 may be in a range of about 700 Å to about 10,000 Å. For example, the thickness of the first electrode EL1 may be in a range of about 700 Å to about 3,000 Å.

The hole transport region HTR may be disposed on the first electrode EL1. The hole transport region HTR may include first to third hole transport layers HTL1, HTL2, and HTL3. For example, the third hole transport layer HTL3 may be directly disposed on the first electrode EL1. The hole transport region HTR may further include an electron blocking layer EBL or a hole injection layer HIL. However, the embodiment of the inventive concept is not limited thereto. Any one of the electron blocking layer EBL or the hole injection layer HIL may be omitted in the organic light emitting elements 10 and 10a according to embodiments.

Referring to FIG. 2, the hole transport region HTR may include the third hole transport layer HTL3, the first hole transport layer HTL1, and the second hole transport layer HTL2, which are sequentially stacked. The second hole transport layer HTL2 may be disposed above the first hole transport layer HTL1, and the third hole transport layer HTL3 may be disposed below the first hole transport layer HTL1. The second refractive index of the second hole transport layer HTL2 may be less than the first refractive index of the first hole transport layer HTL1. The third refractive index of the third hole transport layer HTL3 may be less than the first refractive index of the first hole transport layer HTL1. The first refractive index may be in a range of about 1.7 to about 2.2. For example, the first refractive index may be in a range of about 1.8 to about 1.9. The second refractive index and the third refractive index may each be in a range of about 1.2 to about 1.7. For example, the second refractive index and the third refractive index may each be less than or equal to about 1.6.

A difference between the first refractive index and the second refractive index may be in a range of about 0.1 to about 1.0. The first refractive index may be greater than the second refractive index by about 0.1 to about 1.0. A difference between the first refractive index and the third refractive index may be in a range of about 0.1 to about 1.0. The third refractive index may be less than the first refractive index by about 0.1 to about 1.0. The second refractive index and the third refractive index may be the same as each other. For example, the second refractive index and the third refractive index may be different from each other. A difference between the first refractive index and the second refractive index, and a difference between the first refractive index and the third refractive index may be the same. A difference between the first refractive index and the second refractive index, and a difference between the first refractive index and the third refractive index may be different.

For example, a difference between the first refractive index and the second refractive index may be in a range of about 0.2 to about 1.0. The first refractive index may be greater than the second refractive index by about 0.2 to about 1.0. The third refractive index may be less than the first refractive index by about 0.2 to about 1.0. However, this is presented as an example, and the embodiment of the inventive concept is not limited thereto.

The hole transport region HTR of an embodiment may include the first to third hole transport layers HTL1, HTL2, and HTL3, and may have an increased interface reflection due to a difference in the refractive index between the hole transport layers HTL1, HTL2, and HTL3. The increased interface reflection may cause an upward shift in the direction of light incident from the emission layer EML (which will be described later) to the hole transport region HTR to emit the light upwards. Accordingly, the organic light emitting elements 10 and 10a including the hole transport region HTR according to an embodiment may exhibit improved light emission efficiency.

The thickness T2 of the second hole transport layer HTL2 and the thickness T3 of the third hole transport layer HTL3 may each be in a range of about 10 nm to about 100 nm. The thickness T1 of the first hole transport layer HTL1 may be in a range of about 10 nm to about 100 nm. The thickness T2 of the second hole transport layer HTL2 and the thickness T3 of the third hole transport layer HTL3 may each be in a range of about 30% to about 40% of a total thickness of the first to third hole transport layers HTL1, HTL2, and HTL3. For example, the thickness T2 of the second hole transport layer HTL2 and the thickness T3 of the third hole transport layer HTL3 may each be in a range of about 30% to about 40% with respect to the total thickness of the first to third hole transport layers HTL1, HTL2, and HTL3. The thickness T2 of the second hole transport layer HTL2 may be in a range of about 30% to about 40% with respect to the total thickness of the first to third hole transport layers HTL1, HTL2, and HTL3. The thickness T3 of the third hole transport layer HTL3 may be in a range of about 30% to about 40% with respect to the total thickness of the first to third hole transport layers HTL1, HTL2, and HTL3. For example, the thickness of the second hole transport layer HTL2 may be about 33% of the total thickness of the first to third hole transport layers HTL1, HTL2, and HTL3. The thickness of the third hole transport layer HTL3 may be about 33% of the total thickness of the first to third hole transport layers HTL1, HTL2, and HTL3. The total thickness of the first to third hole transport layers HTL1, HTL2 and HTL3 may be about 300 nm, the thickness T2 of the second hole transport layer HTL2 and the thickness T3 of the third hole transport layer HTL3 may each be about 100 nm. However, this is presented as an example, and the embodiment of the inventive concept is not limited thereto.

According to an embodiment, the ratio of the thickness T2 of the second hole transport layer HTL2, the thickness T1 of the first hole transport layer HTL1, and the thickness T3 of the third hole transport layer HTL3 may be in a range of about 3:4:3 to about 4:2:4. The thickness T1 of the first hole transport layer HTL1 may be greater than the thickness T2 of the second hole transport layer HTL2 and may be greater than the thickness T3 of the third hole transport layer HTL3. The thickness T2 of the second hole transport layer HTL2 and the thickness T3 of the third hole transport layer HTL3 may each be less than the thickness T1 of the first hole transport layer HTL1.

For example, the thickness T1 of the first hole transport layer HTL1 may be less than the thickness T2 of the second hole transport layer HTL2 and may be less than the thickness T3 of the third hole transport layer HTL3. The thickness T2 of the second hole transport layer HTL2 and the thickness T3 of the third hole transport layer HTL3 may each be greater than the thickness T1 of the first hole transport layer HTL1.

The thickness T2 of the second hole transport layer HTL2 and the thickness T3 of the third hole transport layer HTL3 may be the same. For example, the thickness T2 of the second hole transport layer HTL2 and the thickness T3 of the third hole transport layer HTL3 may be different. For example, the ratio of the thickness T2 of the second hole transport layer HTL2, the thickness T1 of the first hole transport layer HTL1, and the thickness T3 of the third hole transport layer HTL3 may be about 3:4:3. However, this is presented as an example, and the embodiment of the inventive concept is not limited thereto.

In the description, the term "substituted or unsubstituted" may indicate that one is substituted or unsubstituted with at least one substituent selected from the group consisting of a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents described above may be substituted or unsubstituted. For example, a biphenyl group may be interpreted as an aryl group or as a phenyl group substituted with a phenyl group.

In the description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. The rings formed by being bonded to each other may be connected to another ring to form a spiro structure.

In the description, examples of a halogen atom may include a fluorine atom, a chlorine atom, a bromine atom, and an iodine atom.

In the description, an alkyl group may be a linear, branched, or cyclic type. The number of carbon atoms in the alkyl group is 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, an n-nonyl group, an n-decyl group, etc., but are not limited thereto.

In the description, the number of carbon atoms in the cycloalkyl group is 3 to 30, 3 to 20, 3 to 10, or 3 to 6. Examples of the cycloalkyl group may include a cyclopentyl group, a cyclohexyl group, a 4-methylcyclohexyl group, a 4-t-butylcyclohexyl group, a cyclooctyl group, etc., but are not limited thereto.

In the description, an aryl group means an any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quingphenyl group, a sexiphenyl group, a triphenylenyl group, a pyrenyl group, a benzofluoranthenyl group, a chrysenyl group, etc., but are not limited thereto.

The second hole transport layer HTL2 and the third hole transport layer HTL3 of an embodiment may each independently include an aromatic compound represented by any one among Formulas 1 to 4 below. The aromatic compound represented by any one among Formulas 1 to 4 may have a relatively lower refractive index. The second refractive index of the second hole transport layer HTL2 and the third refractive index of the third hole transport layer HTL3, which include the aromatic compound represented by any one among Formulas 1 to 4, may each be in a range of about 1.2 to about 1.7.

[Formula 1]

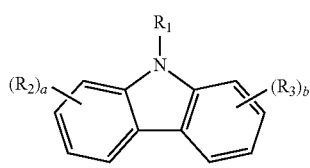

[Formula 2]

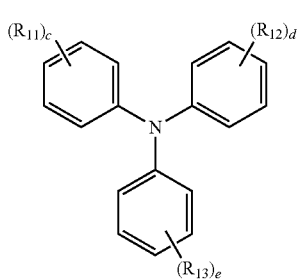

[Formula 3]

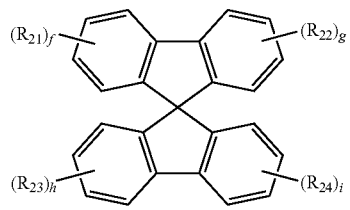

[Formula 4]

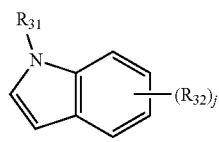

In Formulas 1 to 4, a, b, and f to j may each independently be an integer from 1 to 4, and c to e may each independently be an integer from 1 to 5. When a is an integer of 2 or greater, then the $R_2$ groups may all be the same as or different from each other. When b is an integer of 2 or greater, then the $R_3$ groups may all be the same as or different from each other. When f to i are an integer of 2 or greater, then the $R_{21}$, $R_{22}$, $R_{23}$, and $R_{24}$ groups may all respectively be the same as or different from each other. When j is an integer of 2 or greater, then the $R_{32}$ groups may all be the same as or different from each other. When c to e are an integer of 2 or greater, then the $R_1$ to $R_{13}$ groups may all respectively be the same as or different from each other. For example, when f is an integer of 2 or greater, the $R_{21}$ groups all may be the same as or different from each other. For example, when c is an integer of 2 or greater, the $R_{11}$ groups all may be the same as or different from each other.

In Formulas 1 to 4, $R_1$ to $R_3$, $R_{11}$ to $R_{13}$, $R_{21}$ to $R_{24}$, $R_{31}$, and $R_{32}$ may each independently be a hydrogen atom, a deuterium atom, a halogen atom, a substituted or unsubstituted alkyl group having 1 to 30 carbon atoms, a substituted or unsubstituted cycloalkyl group having 3 to 30 carbon atoms, or a substituted or unsubstituted aryl group having 6 to 30 ring-forming carbon atoms, or bonded to an adjacent group to form a ring. At least one among $R_1$ to $R_3$, at least one among $R_{11}$ to $R_{13}$, at least one among $R_{21}$ to $R_{24}$, and at least one of $R_{31}$ or $R_{32}$ may each independently be a substituted or unsubstituted alkyl group having 1 to 30 carbon atoms, or a substituted or unsubstituted cycloalkyl group having 3 to 30 carbon atoms. However, this is presented as an example, and the embodiment of the inventive concept is not limited thereto.

According to an embodiment, in Formula 2, at least one among $R_{11}$ to $R_{13}$ may each be a substituted or unsubstituted alkyl group having 1 to 10 carbon atoms, or a substituted or unsubstituted cycloalkyl group having 3 to 10 carbon atoms. For example, a compound represented by Formula 2 may be Compound 2-1 or 2-2 below.

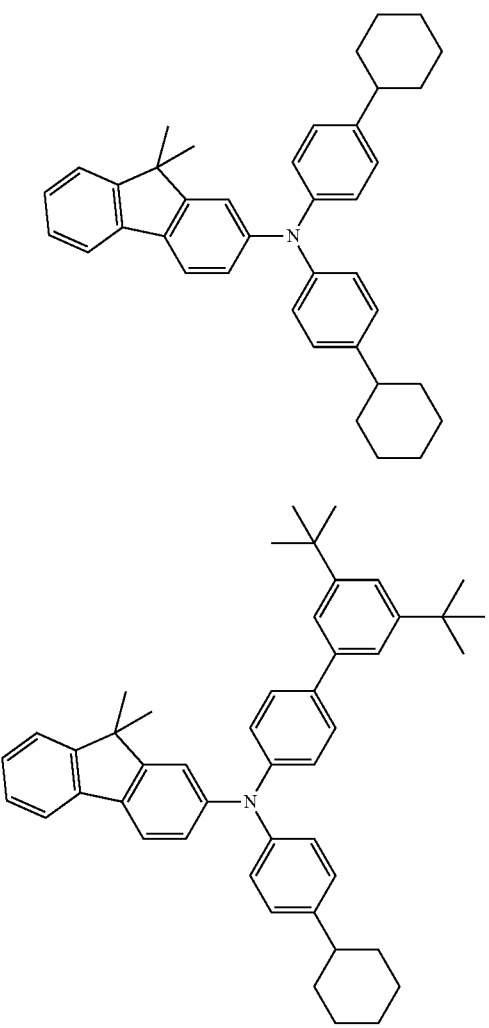

The first hole transport layer HTL1 may include a compound represented by Formula 5 below. The first hole transport layer HTL1 including the compound represented by Formula 5 may exhibit a refractive index in a range of about 1.7 to about 2.2.

[Formula 5]

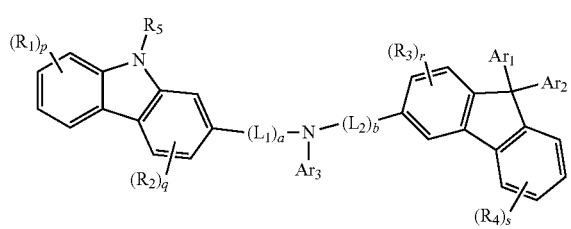

In Formula 5, Ar1 and Ar2 may each independently be a hydrogen atom, a deuterium atom, a halogen atom, a substituted or unsubstituted alkyl group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring. Ar3 may be a substituted or unsubstituted aryl group having 6 to 30 ring-forming carbon atoms, or a substituted or unsubstituted heteroaryl group having 2 to 30 ring-forming carbon atoms.

In Formula 5, a and b may each independently be 0 or 1, and $L_1$ and $L_2$ may be each independently a substituted or unsubstituted cycloalkylene group having 3 to 10 ring-forming carbon atoms, a substituted or unsubstituted heterocycloalkylene group having 2 to 10 ring-forming carbon atoms, a substituted or unsubstituted cycloalkenylene group having 3 to 10 ring-forming carbon atoms, a substituted or unsubstituted arylene group having 6 to 30 ring-forming carbon atoms, or a substituted or unsubstituted heteroarylene group having 2 to 60 ring-forming carbon atoms. In Formula 5, p and s may each independently be an integer from 0 to 4, q and r may each independently be an integer from 0 to 3, and $R_1$ to $R_5$ may each independently be a hydrogen atom, a deuterium atom, a halogen atom, a hydroxy group, a cyano group, a nitro group, an amino group, a substituted or unsubstituted silyl group, a substituted or unsubstituted oxy group, a substituted or unsubstituted alkyl group having 1 to 60 carbon atoms, a substituted or unsubstituted heterocycloalkyl group having 3 to 60 ring-forming carbon atoms, a substituted or unsubstituted aryl group having 6 to 60 ring-forming carbon atoms, or a substituted or unsubstituted heteroaryl group having 2 to 60 ring-forming carbon atoms.

The compound represented by Formula 5 may be represented by at least one of Compounds 1 to 69 in Compound Group 1 below. The first hole transport layer HTL1 of an embodiment may include at least one of the compounds of Compound Group 1 below.

[Compound Group 1]

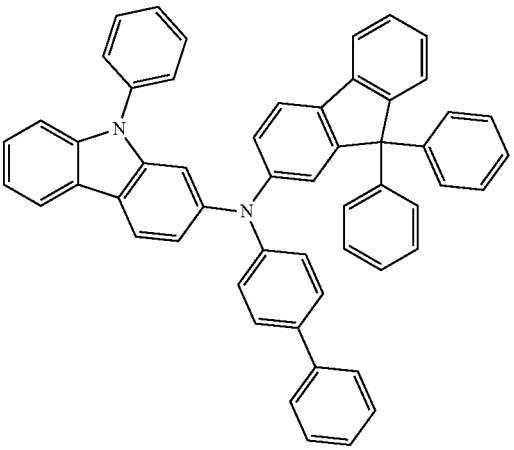

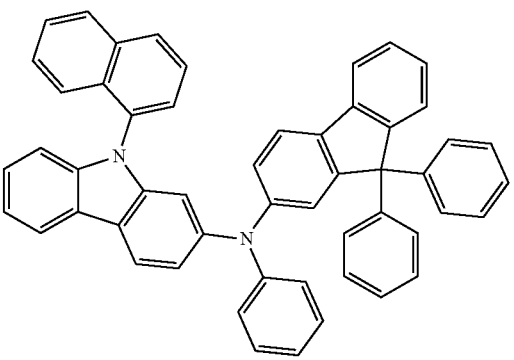

3
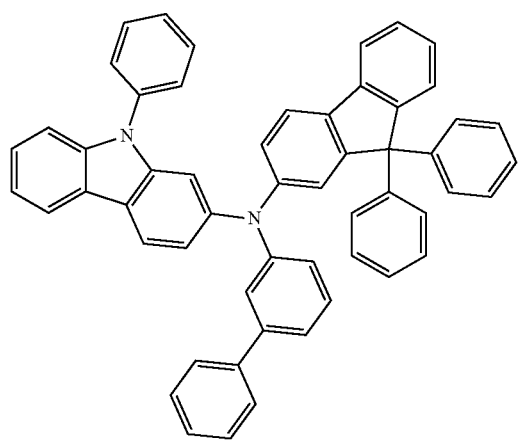
4
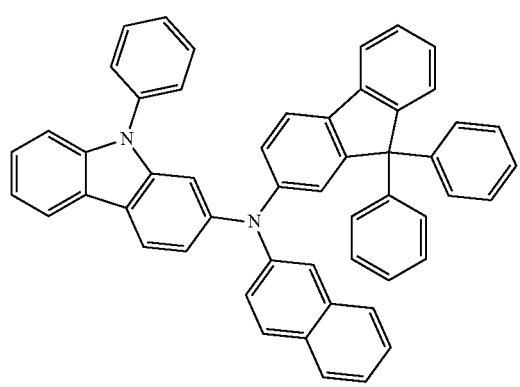
5
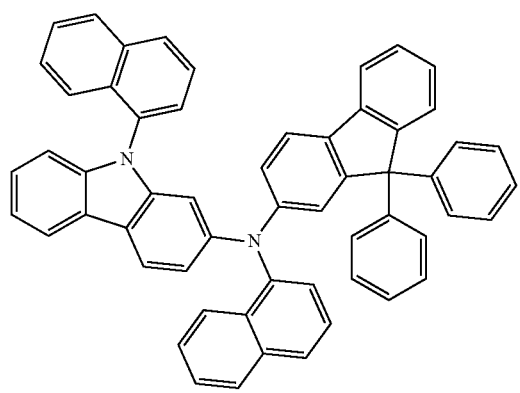
6
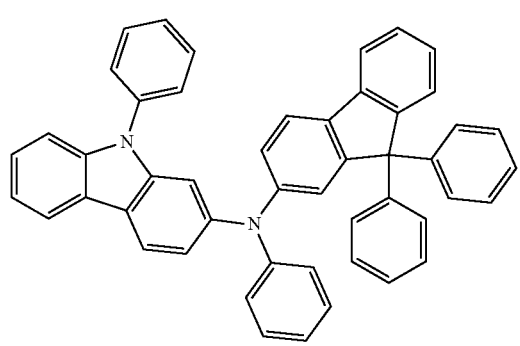
7
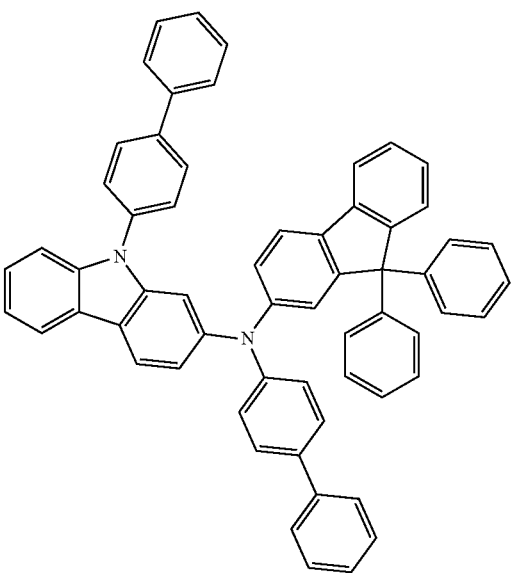
8
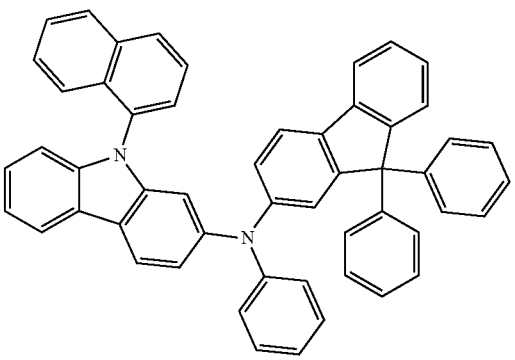
9
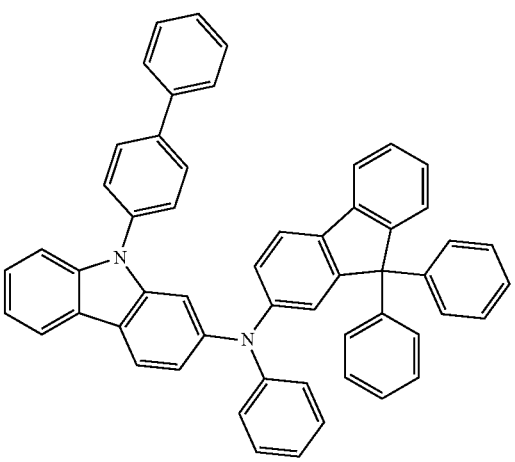

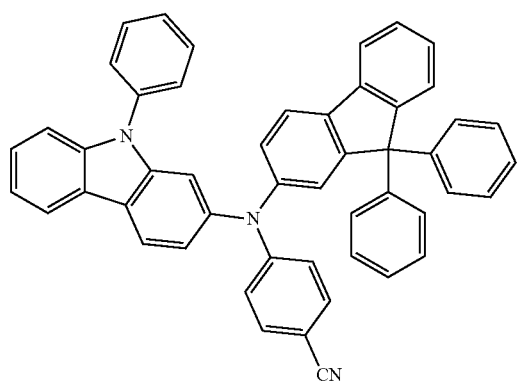
10
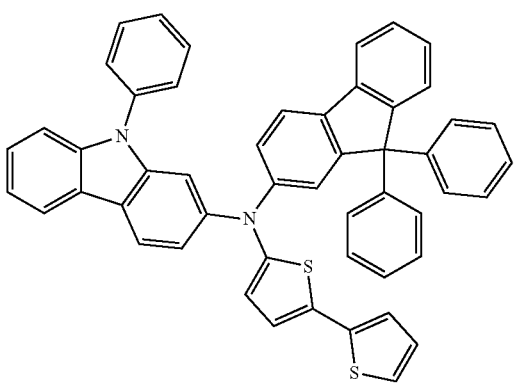
13
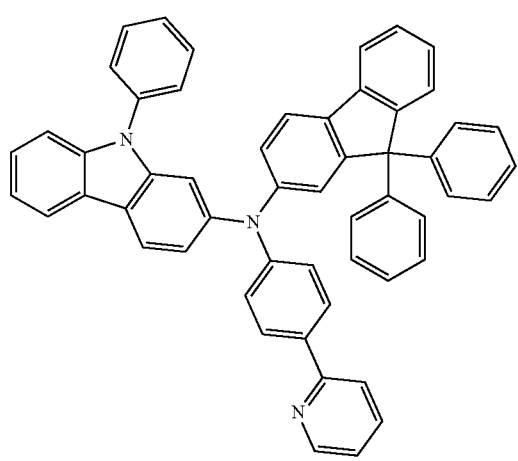
11
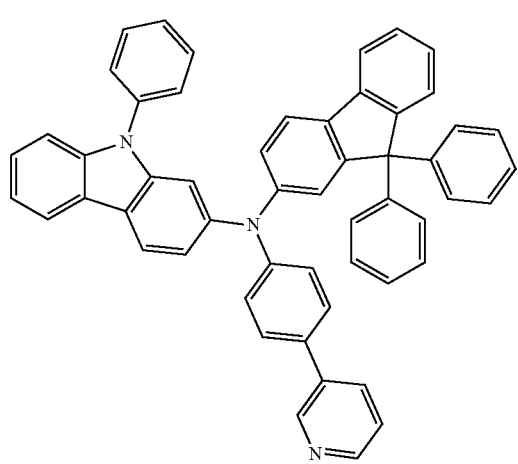
14
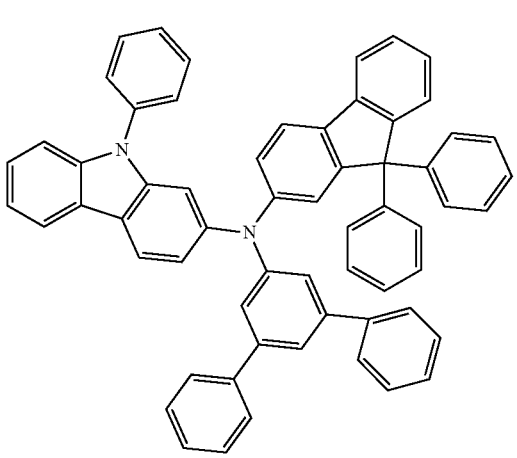
12
15

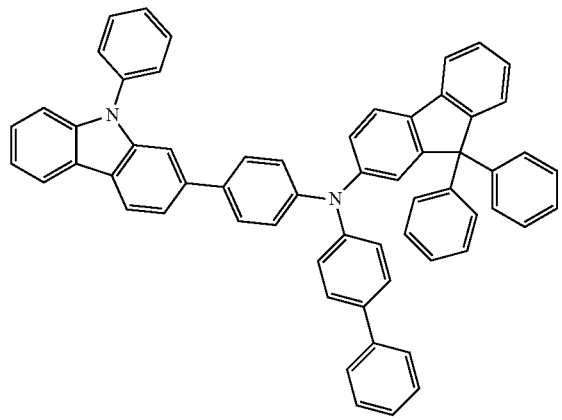
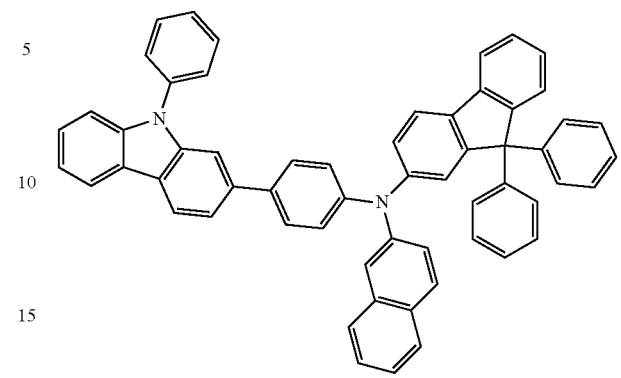
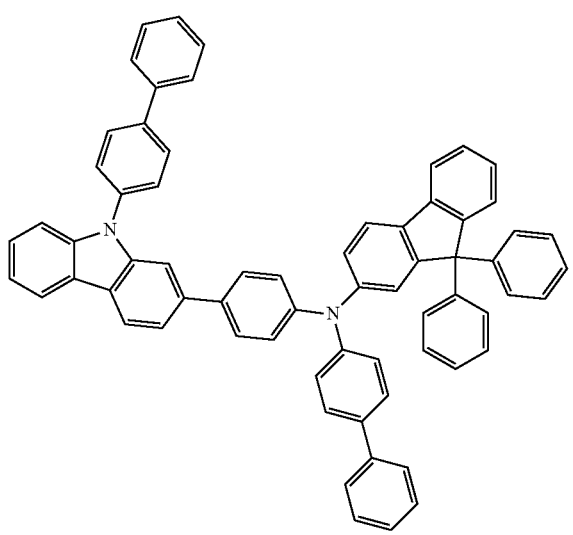
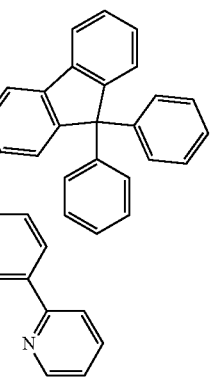
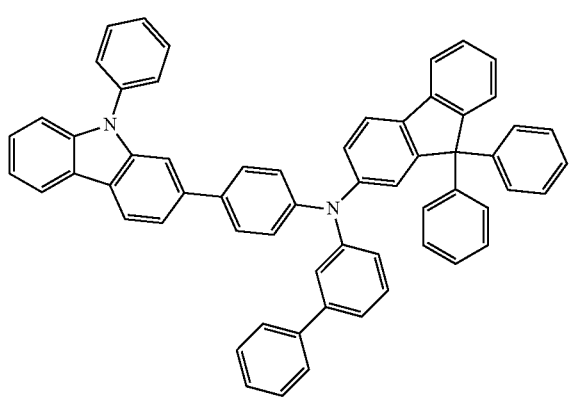

22
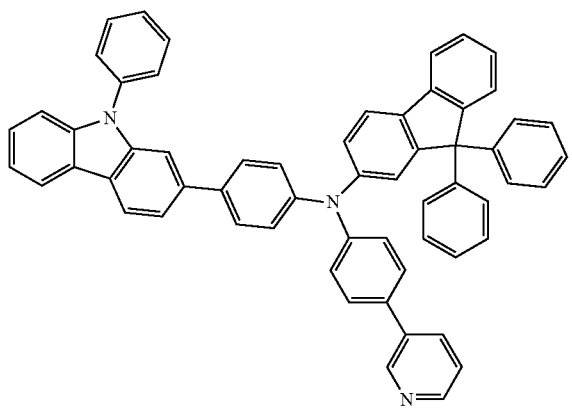
23
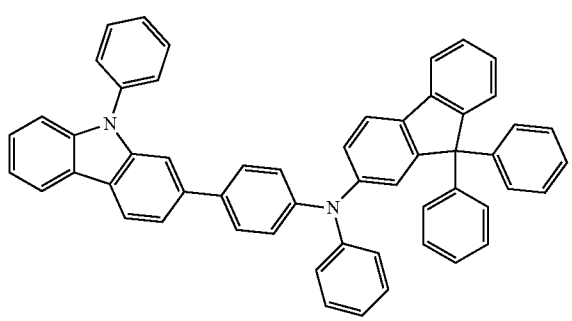
24
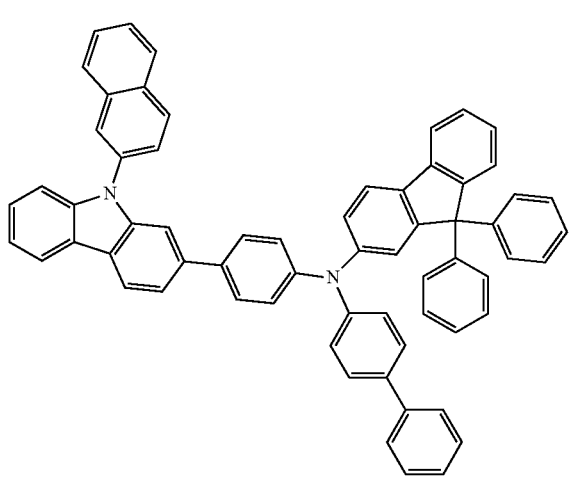
25
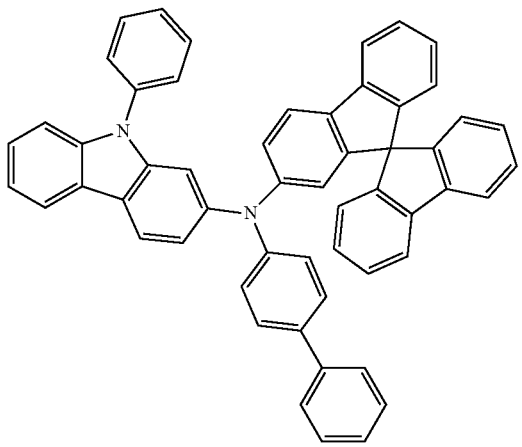
26
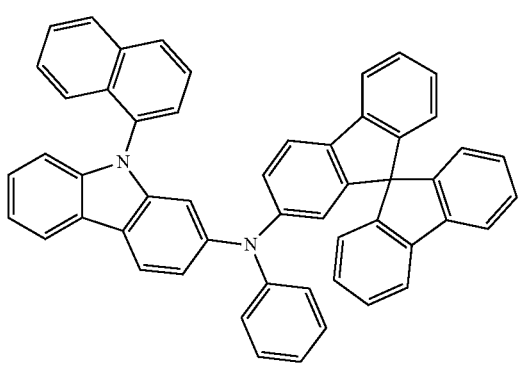
27
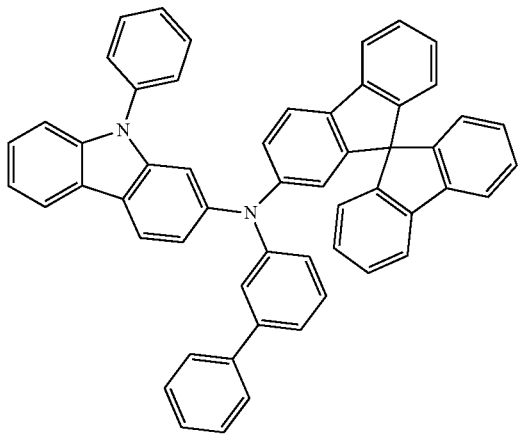
28

29
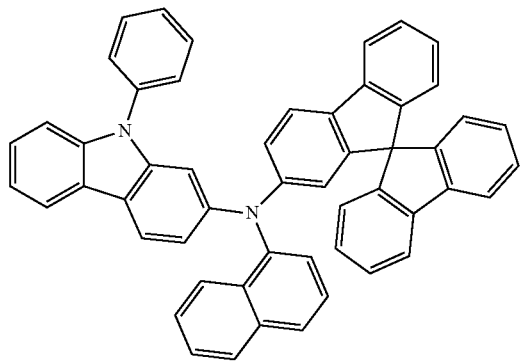
30
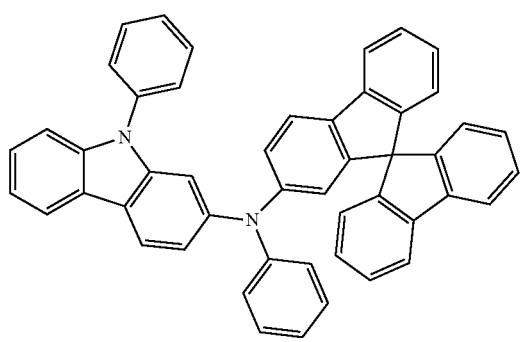
31
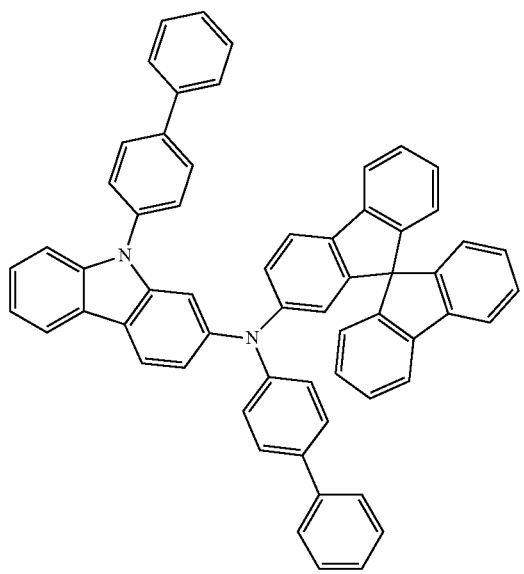
32
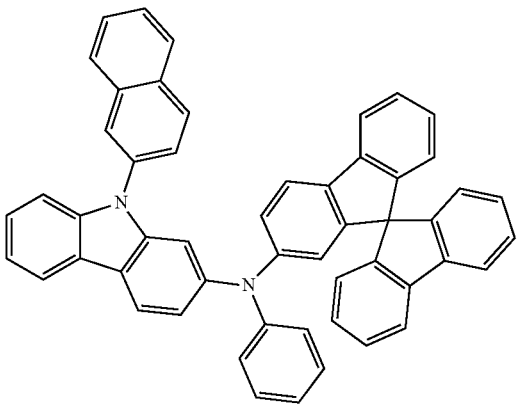
33
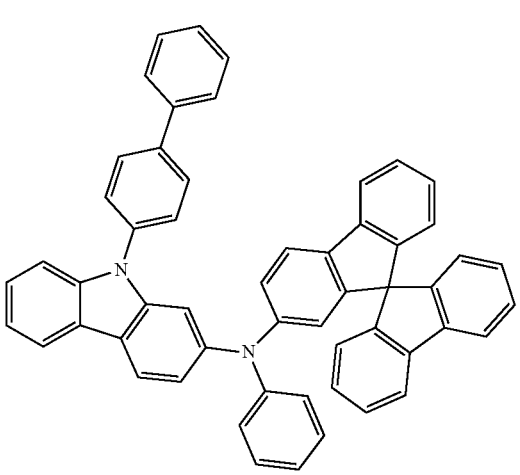
34
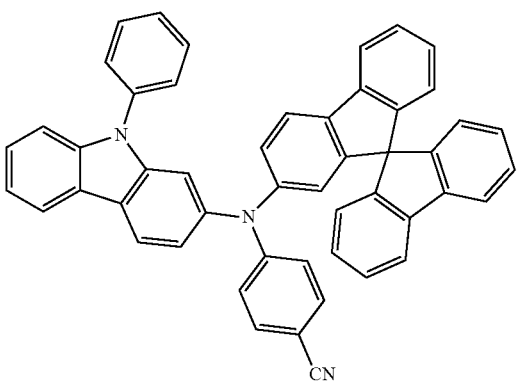

23
-continued
35
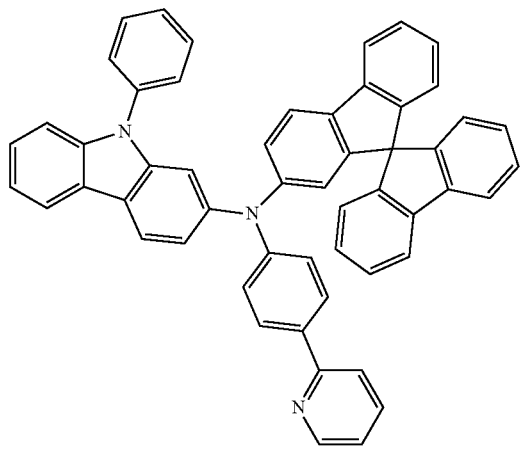
36
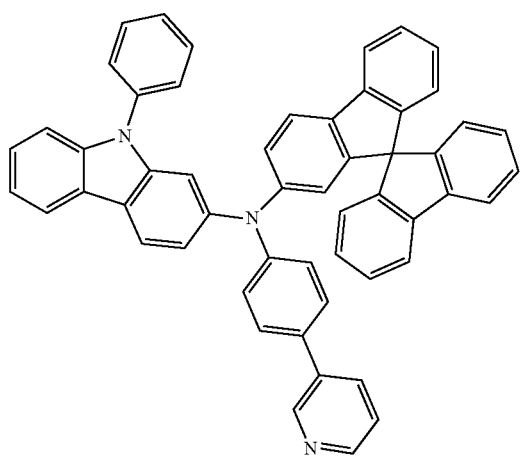
37
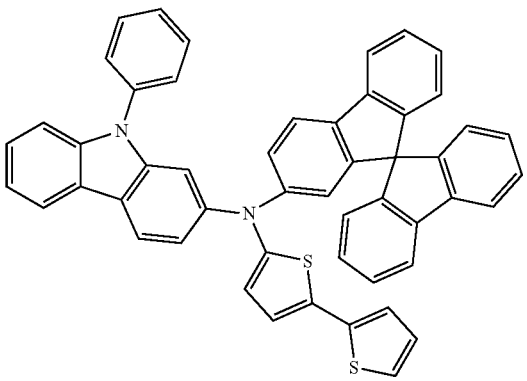
24
-continued
38
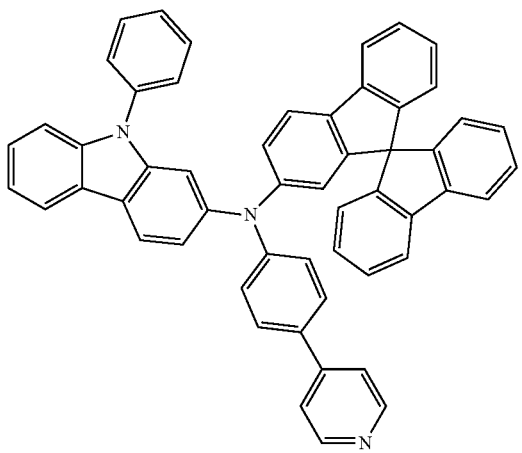
39
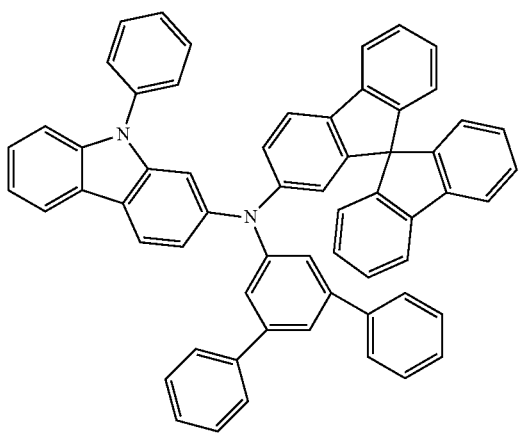
40
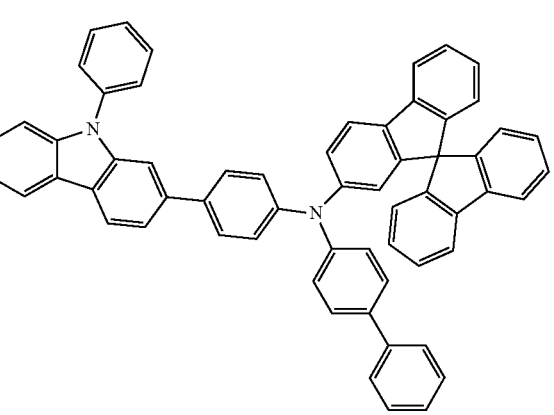

41
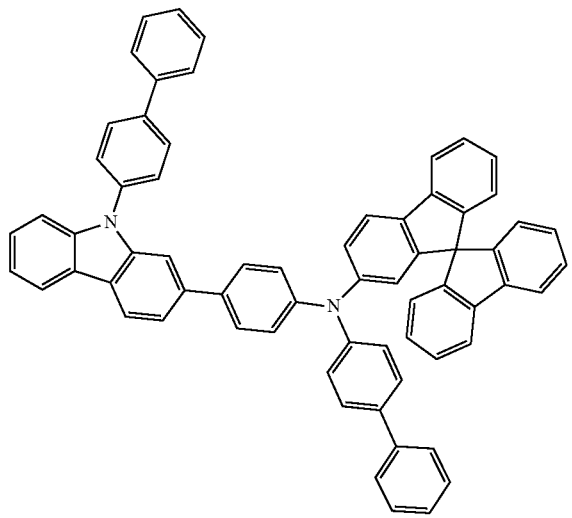
42
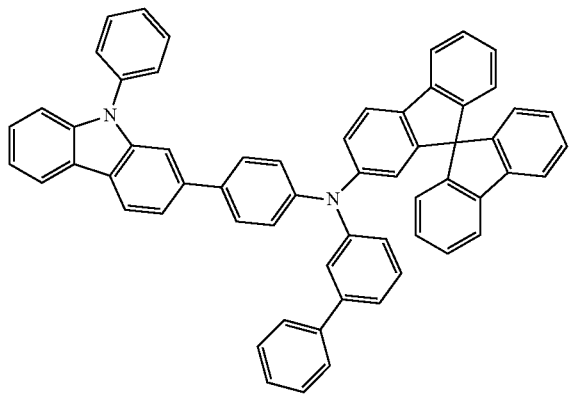
43
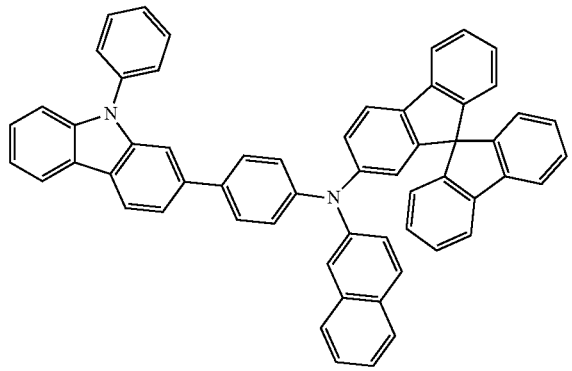
44
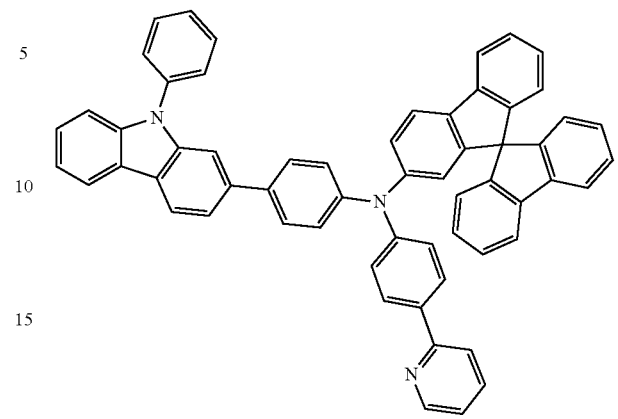
45
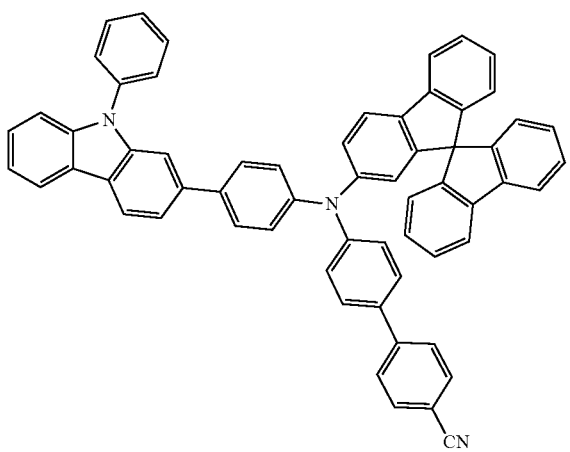
46
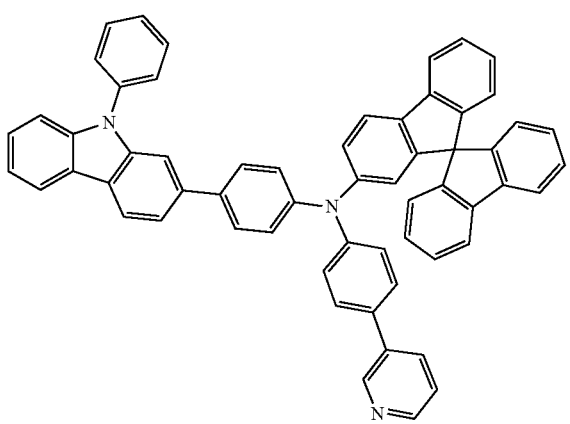

47
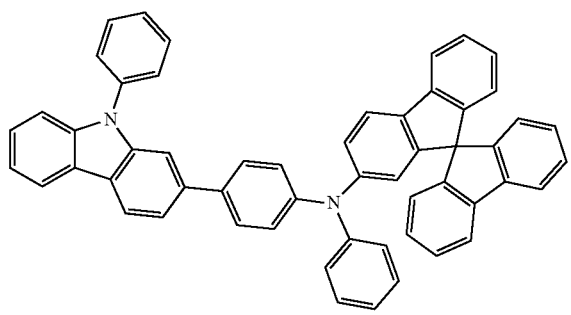
48
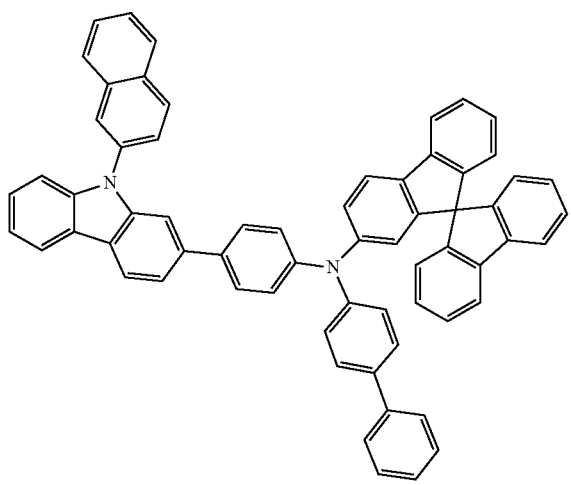
49
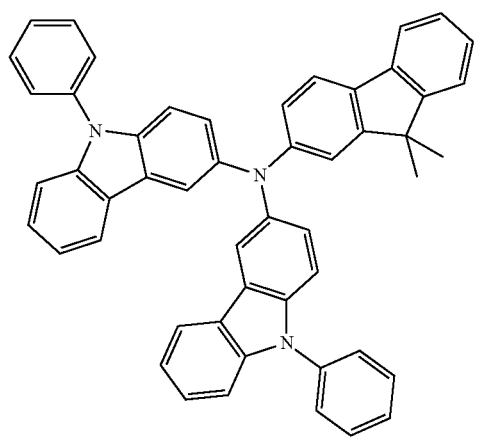
50
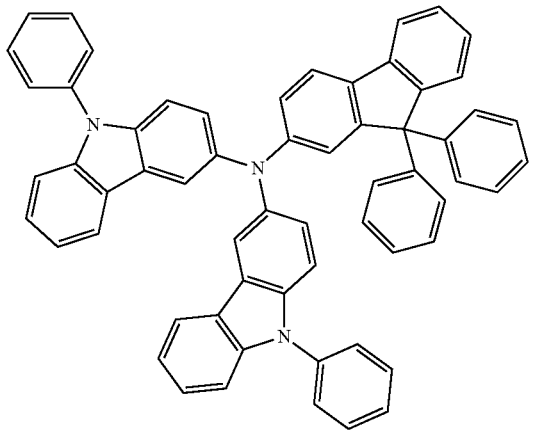
51
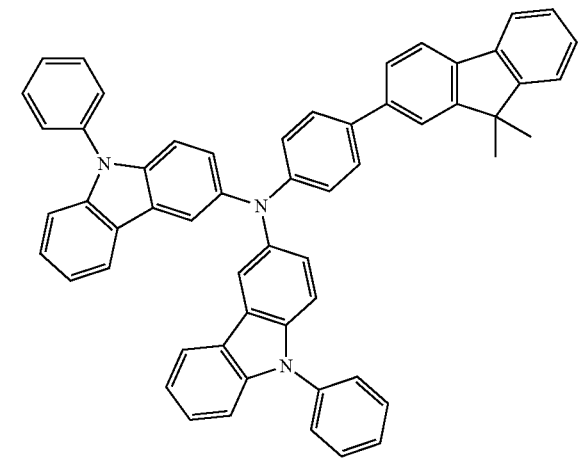
52
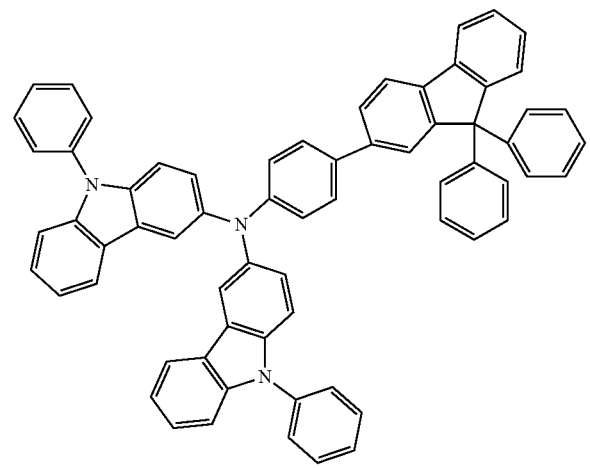

53
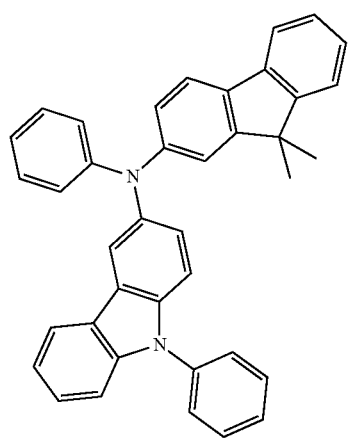
54
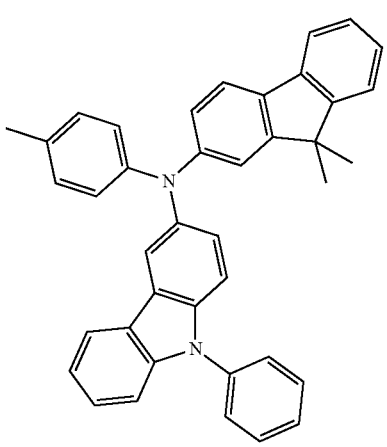
55
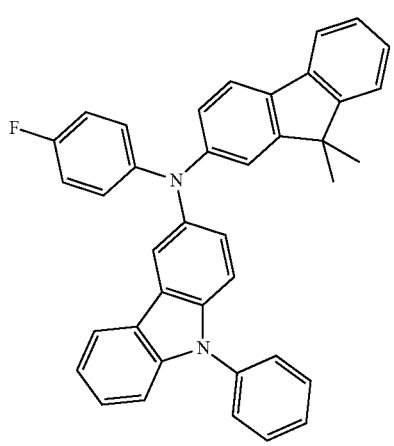
56
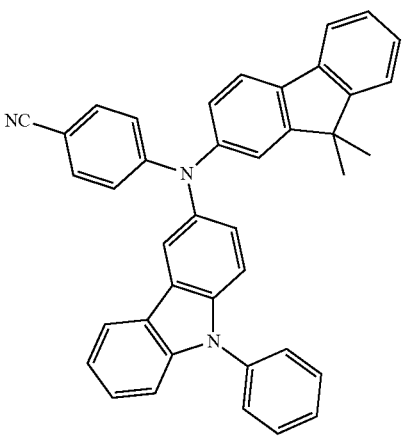
57
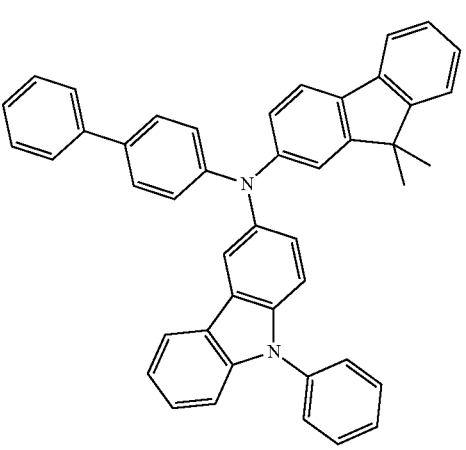
58
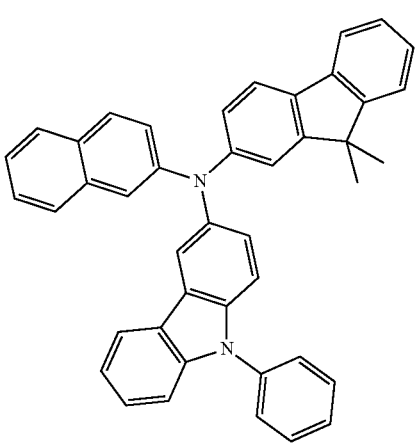

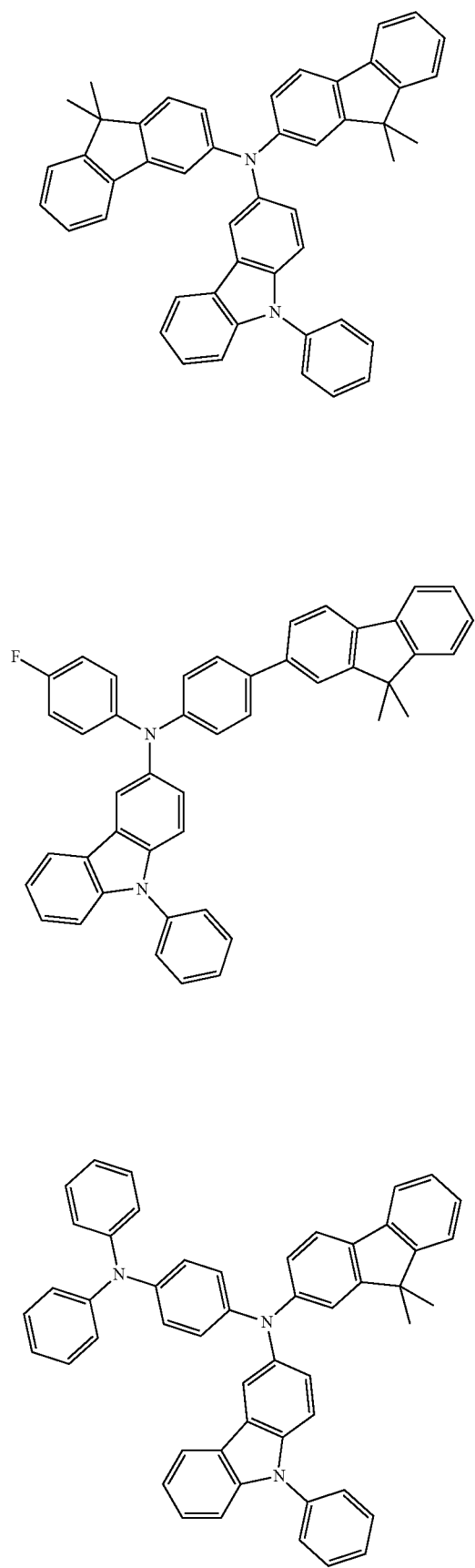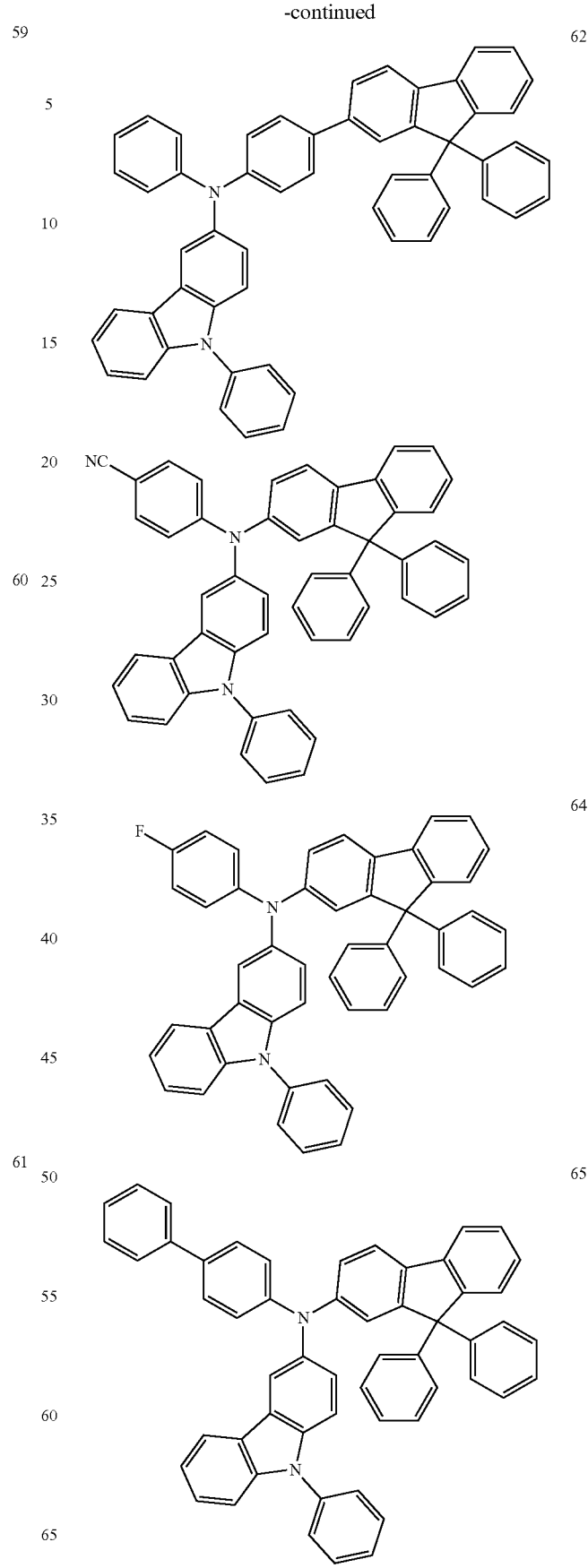

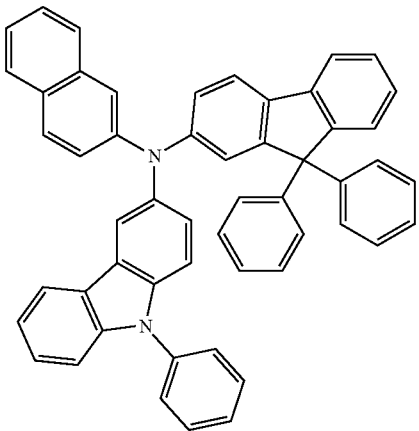

66

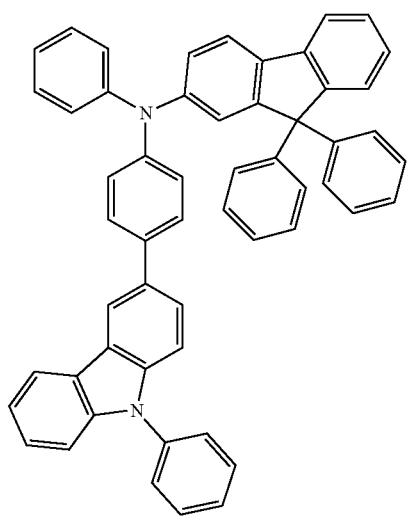

67

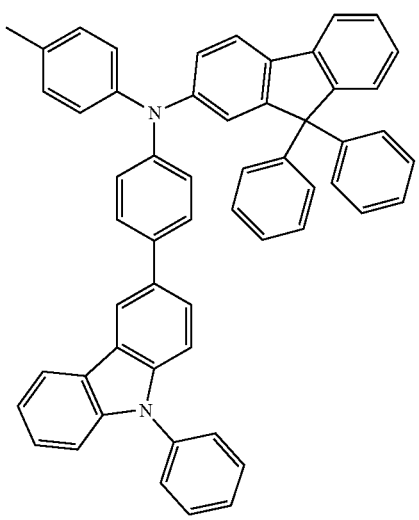

68

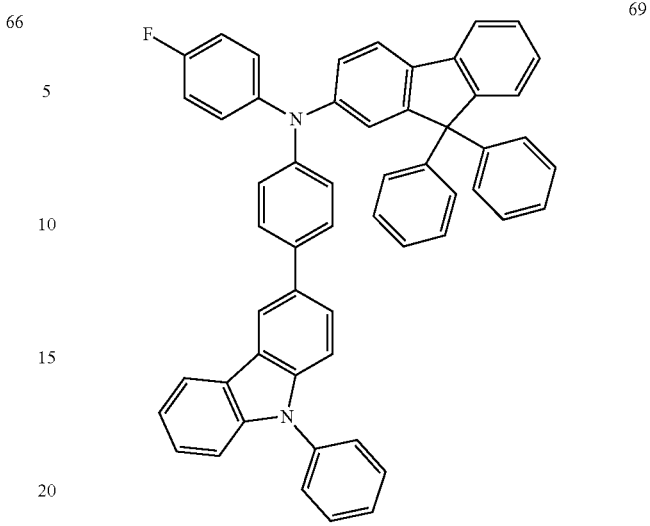

69

According to an embodiment, the hole transport region HTR may further include a hole injection layer HIL or an electron blocking layer EBL. The hole injection layer HIL may be disposed between the first electrode EL1 and the third hole transport layer HTL3. The refractive index of the hole injection layer HIL may be less than the first refractive index of the first hole transport layer HTL1. The refractive index of the hole injection layer HIL may be the same as the refractive index of the third hole transport layer HTL3. For example, the refractive index of the hole injection layer HIL may be different from the refractive index of the third hole transport layer HTL3. The refractive index of the hole injection layer HIL may be in a range of about 1.2 to about 1.7. A difference between the first refractive index and the refractive index of the hole injection layer HIL may be in a range of about 0.1 to about 1.0.

The hole injection layer HIL may include an aromatic compound represented by any one among Formulas 1 to 4 described above.

The electron blocking layer EBL may be disposed between the second hole transport layer HTL2 and the emission layer EML. The refractive index of the electron blocking layer EBL may be greater than the second refractive index of the second hole transport layer HTL2. The refractive index of the electron blocking layer EBL may be greater than the refractive index of the emission layer EML which will be described later. For example, the refractive index of the electron blocking layer EBL may be greater than the second refractive index and the refractive index of the emission layer EML. The electron blocking layer EBL may have a refractive index in a range of about 1.7 to about 2.2. A difference between the refractive index of the electron blocking layer EBL and the second refractive index, and a difference between the refractive index of the electron blocking layer EBL and the refractive index of the emission layer EML may each be in a range of about 0.1 to about 1.0.

According to an embodiment, the hole transport region HTR may include the first to third hole transport layers HTL1, HTL2, and HTL3. The second hole transport layer HTL2 and the third hole transport layer HTL3 among the first to third hole transport layers HTL1, HTL2, and HTL3 may be disposed above or below the first hole transport layer HTL1. The second hole transport layer HTL2 and the third hole transport layer HTL3 have a lower refractive index lower than the first hole transport layer HTL1, and thus a difference between the first refractive index of the first hole transport layer HTL1 and the second refractive index of the second hole transport layer HTL2, and a difference between the first refractive index of the first hole transport layer HTL1 and the third refractive index of the third hole transport layer HTL3 may each be in a range of about 0.1 to about 1.0.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include an aromatic compound represented by any one among Formulas 1 to 4 described above. The hole injection layer HIL may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f.2',3'-h]quinoxaline-2,3,6,7,10,11-hexacarbonitrile (HAT-CN), etc.

The first to third hole transport layers HTL1, HTL2 and HTL3 each may further include a known hole transport layer material. For example, the first to third hole transport layers HTL1, HTL2 and HTL3 each may further include carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine](TAPC), 4,4'-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be one among quinone derivatives, metal oxides, and cyano group-containing compounds, but is not limited thereto. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, etc., but are not limited thereto.

The emission layer EML is provided on the hole transport region HTR. According to an embodiment, the refractive index of the emission layer EML may be less than the first refractive index described above. The emission layer EML may have a refractive index in a range of about 1.2 to about 1.7. When the hole transport region HTR includes the electron blocking layer EBL, the refractive index of the emission layer EML may be less than the refractive index of the electron blocking layer EBL. The refractive index of the emission layer EML may be the same as the second refractive index. The refractive index of the emission layer EML may be the same as the third refractive index. For example, the refractive index of the emission layer EML may be different from the second refractive index. The refractive index of the emission layer EML may be different from the third refractive index. The refractive index of the emission layer EML, the second refractive index, and the third refractive index may all be the same. However, this is presented as an example, and the embodiment of the inventive concept is not limited thereto. A difference between the refractive index of the emission layer EML and the first refractive index may be in a range of about 0.1 to about 1.0. A difference between the refractive index of the emission layer EML and the refractive index of the electron blocking layer EBL may be in a range of about 0.1 to about 1.0.

The emission layer EML may have, for example, a thickness in a range of about 100 Å to about 1000 Å. For example, the thickness of the emission layer EML may be in a range of about 100 Å to about 300 Å. The emission layer EML may have a single layer formed of a single material, a single layer formed of different materials, or a multilayer structure having multiple layers formed of different materials.

The emission layer EML may include an aromatic compound represented by any one among Formulas 1 to 4 described above. The emission layer EML may further include an anthracene derivative, a pyrene derivative, a fluoranthene derivative, a chrysene derivative, a dihydrobenzanthracene derivative, or a triphenylene derivative. For example, the emission layer EML may further include an anthracene derivative or a pyrene derivative.

For example, the emission layer EML may further include an anthracene derivative represented by Formula A below.

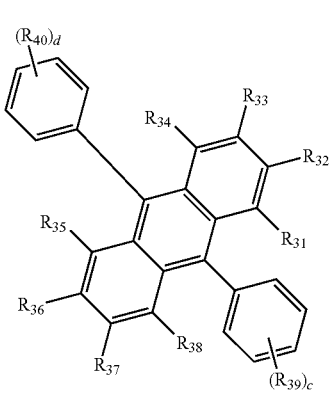

[Formula A]

In Formula A, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group of 6 to 30 ring-forming carbon atoms, or a substituted or unsubstituted heteroaryl group having 2 to 30 ring-forming carbon atoms, or bonded to an adjacent group to form a ring. In Formula A, $R_{31}$ to $R_{40}$ may be bonded to an adjacent group to form a saturated hydrocarbon ring or an unsaturated hydrocarbon ring. For example, in Formula A, $R_{31}$ to $R_{40}$ may be optionally bonded to an adjacent group to form a saturated hydrocarbon ring or an unsaturated hydrocarbon ring. In Formula A, c and d may each independently be an integer from 0 to 5.

Formula A may be represented by any one among Compounds 3-1 to 3-16 below.

3-1

3-2

3-3

3-4

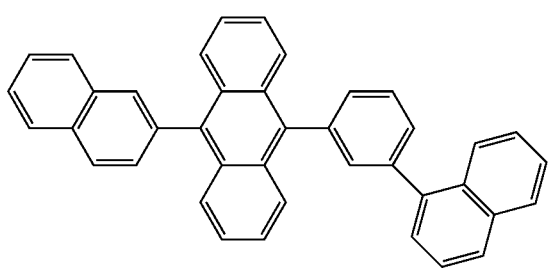

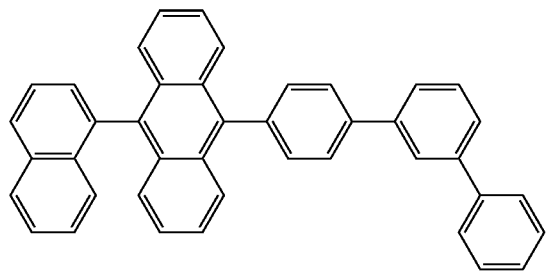

-continued 3-5

3-6

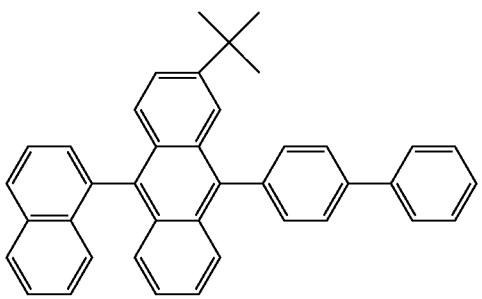

3-7

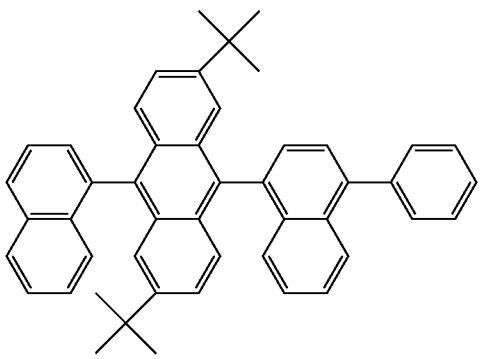

3-8

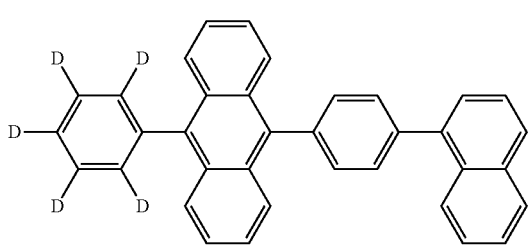

3-9

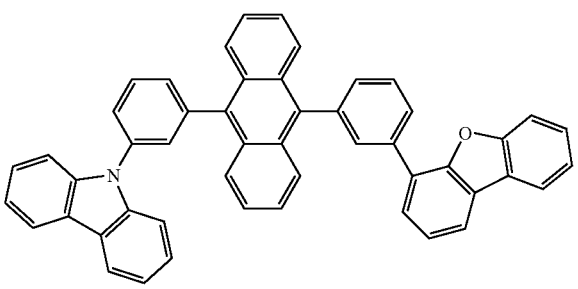

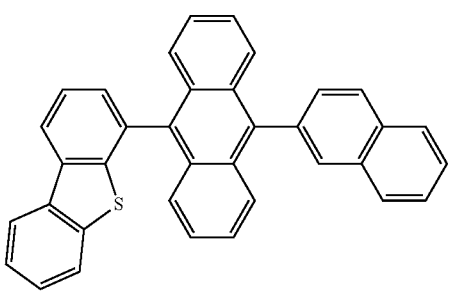

-continued 3-10

3-11

3-12

3-13

3-14

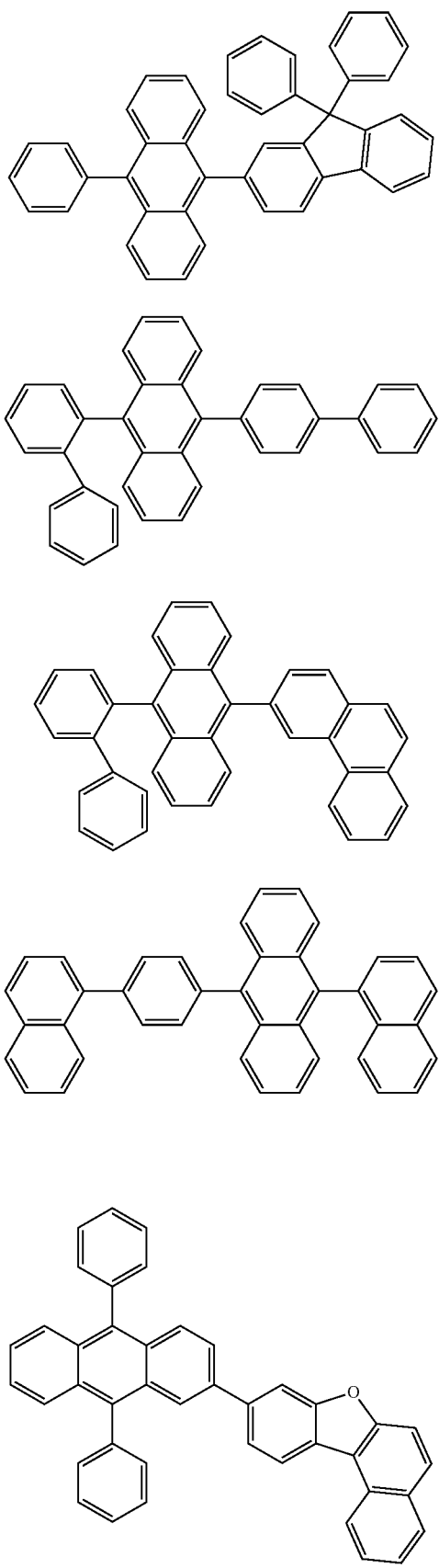

-continued 3-15

3-16

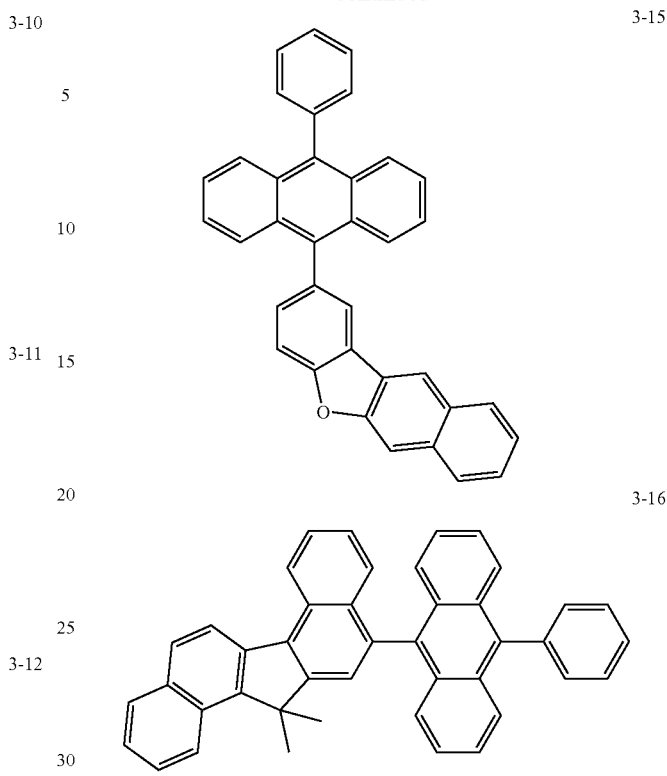

In the organic light emitting elements 10 and 10a of an embodiment, the emission layer EML may include a host and a dopant, and the emission layer EML may include the compound represented by Formula A described above as a host material.

The emission layer EML may further include a general material known in the art as a host material. For example, the emission layer EML may include, as a host material, at least one among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl) benzene (TPBi). However, the embodiment of the inventive concept is not limited thereto, and for example, tris(8-hydroxyquinolino)aluminum (Alq3), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO3), octaphenylcyclotetrasiloxane (DPSiO4), etc. may be used as a host material.

The emission layer EML may include, as a known dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may include a known phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. For example, iridium(III) bis(4,6-difluorophenylpyridinato-N,C2')picolinate (FLrpic), bis(2,4-difluorophenylpyridinato)-tetrakis(1-pyrazolyl)borate iridium (III) (Fir6), platinum octaethyl porphyrin (PtOEP), etc. may be used. However, the embodiment of the inventive concept is not limited thereto. The emission layer EML may further include a known phosphorescent host material, for example, may further include bis(4-(9H-carbazol-9-yl)phenyl)diphenylsilane (BCPDS).

The emission layer EML may emit blue light. The emission layer EML may further include a fluorescent material including any one selected from the group consisting of, for example, spiro-DPVBi, spiro-6P, distyryl-benzene (DSB), distyryl-arylene (DSA), a polyfluorene-based polymer (PFO), and a poly(p-phenylene vinylene)-based polymer (PPV). When the emission layer EML emits blue light, a dopant included in the emission layer EML may be selected from, for example, a metal complex such as (4,6-F2ppy)2Irpic or an organometallic complex, perylene and derivatives thereof.

According to an embodiment, the electron transport region ETR may be disposed on the emission layer EML and may include an electron transport layer ETL. The electron transport region ETR may include a hole blocking layer HBL. The hole blocking layer HBL may be disposed between the emission layer EML and the electron transport layer ETL. For example, the hole blocking layer HBL may be disposed on the emission layer. The hole blocking layer HBL may have a refractive index in a range of about 1.7 to about 2.2. The refractive index of the hole blocking layer HBL may be greater than the refractive index of the emission layer EML. The refractive index of the hole blocking layer HBL may be greater than the refractive index of the electron transport layer ETL. A difference between the refractive index of the hole blocking layer HBL and the refractive index of the emission layer EML, and a difference between the refractive index of the hole blocking layer HBL and the refractive index of the electron transport layer ETL may be in a range of about 0.1 to about 1.0.

The refractive index of the electron transport layer ETL may be less than the first refractive index. The electron transport layer ETL may have a refractive index in a range of about 1.2 to about 1.7. A difference between the first refractive index and the refractive index of the electron transport layer ETL may be in a range of about 0.1 to about 1.0. The refractive index of the electron transport layer ETL may be the same as the refractive index of the emission layer EML. For example, the refractive index of the electron transport layer ETL may be different from the refractive index of the emission layer EML. The refractive index of the electron transport layer ETL may be less than the refractive index of the hole blocking layer HBL. As described above, a difference between the refractive index of the hole blocking layer HBL and the refractive index of the electron transport layer ETL may be in a range of about 0.1 to about 1.0. The electron transport layer ETL may include an aromatic compound represented by any one among Formulas 1 to 4 described above.

The second refractive index of the second hole transport layer HTL2, the third refractive index of the third hole transport layer HTL3, the refractive index of the emission layer EML, and the refractive index of the electron transport layer ETL may be the same. For example, the second refractive index of the second hole transport layer HTL2, the third refractive index of the third hole transport layer HTL3, the refractive index of the emission layer EML, and the refractive index of the electron transport layer ETL may be different from each other. For example, the third refractive index, the refractive index of the emission layer EML, and the refractive index of the electron transport layer ETL may be the same, and the second refractive index may be different. For example, the third refractive index and the refractive index of the electron transport layer ETL may be the same, and the second refractive index and the refractive index of the emission layer EML may be different from the third refractive index and the refractive index of the electron transport layer ETL. The third refractive index and the refractive index of the emission layer EML may be the same, and the second refractive index and the refractive index of the electron transport layer ETL may be different from the third refractive index and the refractive index of the emission layer EML. However, this is presented as an example, and the embodiment of the inventive concept is not limited thereto.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include an anthracene-based compound. However, the embodiment of the inventive concept is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato) aluminum (BAlq), berylliumbis(benzoquinolin-10-olate (Bebg2), 9,10-di(naphthalene-2-yl)anthracene (ADN), 1,3-bis[3,5-di(pyridin-3-yl)phenyl]benzene (BmPyPhB), or a mixture thereof. A thickness of the electron transport layer ETL may be in a range of about 100 Å to about 1,000 Å. For example, the thickness of the electron transport layer ETL may be in a range of about 150 Å to about 500 Å. When the thickness of the electron transport layer ETL satisfies the above-described range, satisfactory electron transport properties may be obtained without a substantial increase in driving voltage.

The electron transport region ETR may further include an electron injection layer EIL. When the electron transport region ETR includes the electron injection layer EIL, the electron transport region ETR may be a halogenated metal such as LiF, NaCl, CsF, RbCl, RbI, CuI, and KI, a lanthanide metal such as Yb, combination materials of a halogenated metal and a lanthanide metal such as KI:Yb and RbI:Yb, a metal oxide such as Li2O and BaO, or lithium quinolate (LiQ), but is not limited thereto. The electron injection layer EIL may also be formed of a mixture material of an electron transport material and an insulating organo-metal salt. The organo-metal salt may be a material having an energy band gap of greater than or equal to about 4 eV. For example, the organo-metal salt may include, for example, metal acetates, metal benzoates, metal acetoacetates, metal acetylacetonates, or metal stearates. A thickness of the electron injection layer EIL may be in a range of about 1 Å to about 100 Å. For example, the thickness of the electron injection layer EIL may be in a range of about 3 Å to about 90 Å. When the thickness of the electron injection layer EIL satisfies the above-described range, satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP) or 4,7-diphenyl-1,10-phenanthroline (Bphen), but the embodiment of the inventive concept is not limited thereto.

The second electrode EL2 is provided on the electron transport region ETR. The second electrode EL2 may be a common electrode. The second electrode EL2 may be an anode or a cathode. For example, when the first electrode EL1 is an anode, the second electrode EL2 may be a cathode. For example, when the first electrode EL1 is a cathode, the second electrode EL2 may be an anode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (e.g., AgMg, AgYb, or MgAg). For example, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

Although not shown, the second electrode EL2 may be connected with an auxiliary electrode. When the second electrode EL2 is connected with the auxiliary electrode, the resistance of the second electrode EL2 may decrease.

A capping layer CPL may be further disposed on the second electrode EL2. The capping layer CPL may be a single layer or a multilayer. The capping layer CPL may be an organic layer or an inorganic layer. For example, when the capping layer CPL includes an inorganic material, the inorganic material may include an alkali metal compound such as LiF, an alkaline earth metal compound such as MgF2, SiON, SiNx, SiOy, etc.

For example, when the capping layer CPL includes an organic material, the organic material may include a-NPD, NPB, TPD, m-MTDATA, Alq3, CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or may include epoxy resins or acrylates such as methacrylate. However, the embodiment of the inventive concept is not limited thereto, and compounds P1 to P5 below may also be included.

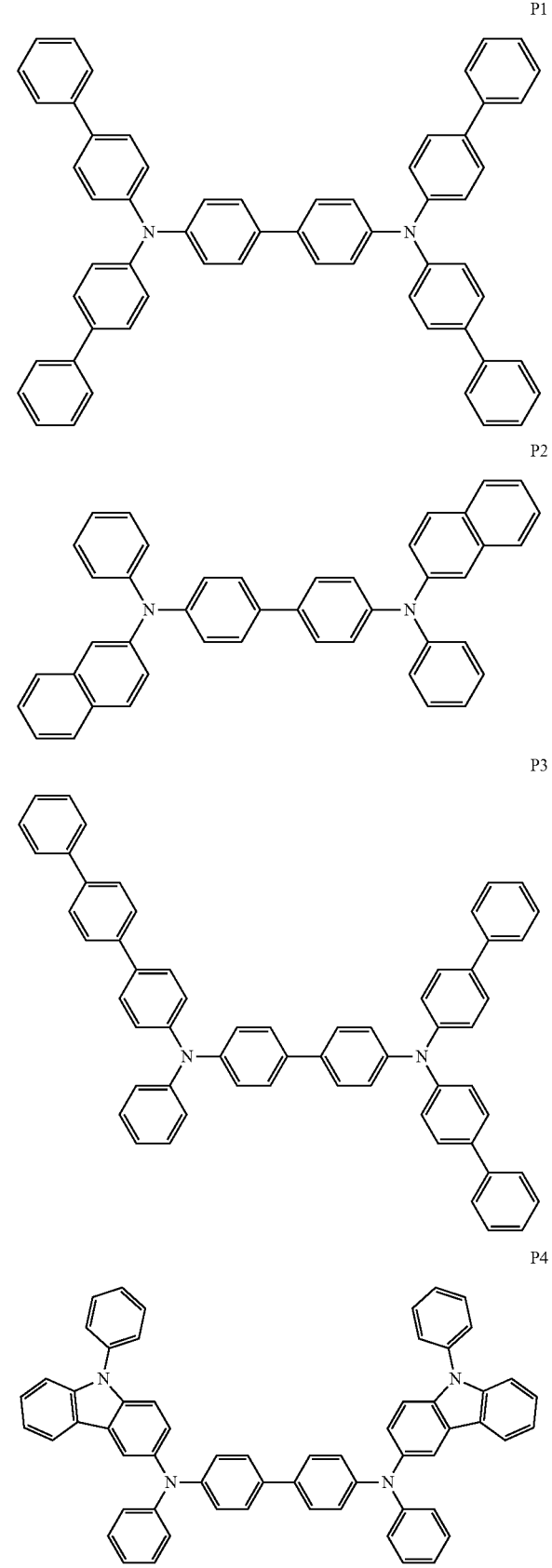

-continued

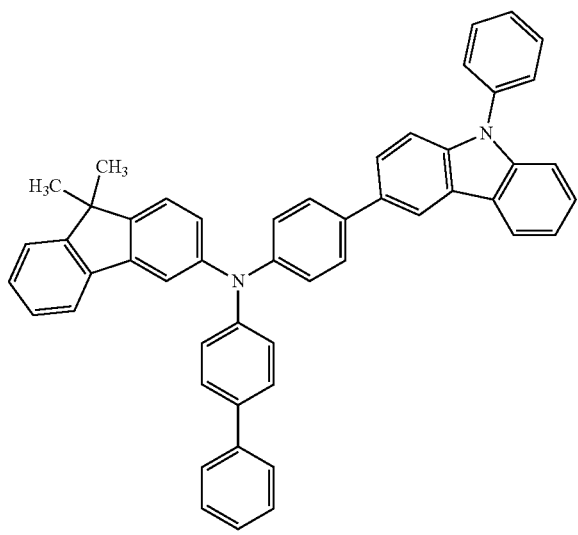

P5

The refractive index of the capping layer CPL may be equal to or greater than about 1.6. For example, the refractive index of the capping layer CPL may be equal to or greater than about 1.6 in a wavelength range of about 550 nm to about 660 nm.

An encapsulation layer (not shown) may be further included on the capping layer CPL. The encapsulation layer may be an organic layer, an inorganic layer, or a composite material layer. The encapsulation layer may include at least one organic layer and at least one inorganic layer. The organic layer included in the encapsulation layer may be a compound in which photopolymerization is operable, and may include, for example, an acrylic-based material or an epoxy-based material. The inorganic layer included in the encapsulation layer may include materials such as SiON, SiOx, and SiNy.

Figure 3:
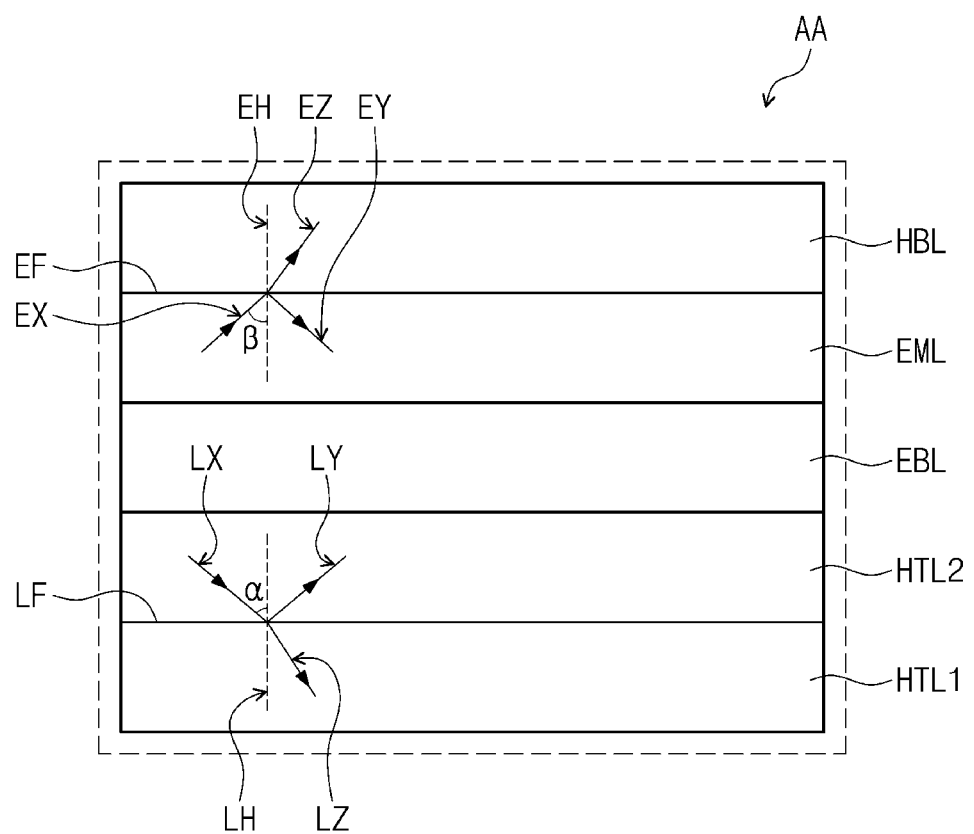
FIG. 3 is a schematic cross-sectional view illustrating a part of an organic light emitting element according to an embodiment.

FIG. 3 is an enlarged schematic cross-sectional view of region AA of FIG. 2, and shows how reflection is caused at an interface LF between the second hole transport layer HTL2 and the first hole transport layer HTL1, and at an interface EF between the emission layer EML and the hole blocking layer HBL. FIG. 3 shows that light LX generated in the emission layer EML and incident on the second hole transport layer HTL2 is reflected at the interface LF between the second hole transport layer HTL2 and the first hole transport layer HTL1. The greater a difference between the second refractive index of the second hole transport layer HTL2 and the first refractive index of the first hole transport layer HTL1 is, the larger an angle α between a line LH perpendicular to the interface LF and incident light LX becomes. When the angle α increases, light LZ directed downwards may decrease, and light LY directed upwards may increase.

FIG. 3 shows that light EX generated in the emission EML and directed to the hole blocking layer HBL is reflected at the interface EF between the emission layer EML and the hole blocking layer HBL. The greater a difference between the refractive index of the emission layer EML and the refractive index of the hole blocking layer HBL is, the larger an angle β between a line EH perpendicular to the interface EF and the incident light EX becomes. When the angle β increases, light EY directed downwards may decrease, and light EZ directed upwards may increase.

The organic light emitting elements 10 and 10a according to an embodiment may include the second hole transport layer HTL2, the third hole transport layer HTL3, the emission layer EML, and the electron transport layer ETL, which each have a lower refractive index than the first hole transport layer HTL1 and which each have a lower refractive index than the hole blocking layer HBL. The refractive index of the second hole transport layer HTL2, the refractive index of the third hole transport layer HTL3, the refractive index of the emission layer EML, and the refractive index of the electron transport layer ETL may each be less than the refractive index of the first hole transport layer HTL1 by about 0.1 to about 1.0. An increase in reflection due to a difference in refractive index may cause an increase in an amount of light directed upwards in the emission layer EML. Accordingly, the organic light emitting elements 10 and 10a of an embodiment may exhibit excellent light emission efficiency.

Figure 4:
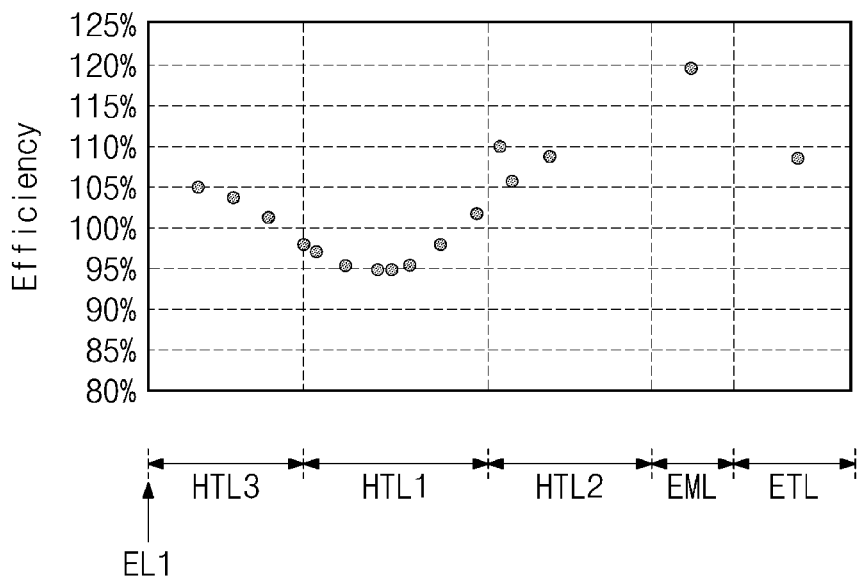
FIG. 4 is a graph showing light emission efficiency according to a location of a layer having a low refractive index.

The graph of FIG. 4 shows light emission efficiency when any one functional layer among the first to third hole transport layers HTL1, HTL2, and HTL3, the emission layer EML, and the electron transport layer ETL has a refractive index of about 1.62. The graph of FIG. 4 shows light emission efficiency of an organic light emitting element when any one functional layer among the first to third hole transport layers HTL1, HTL2, and HTL3, the emission layer EML, and the electron transport layer ETL included in the organic light emitting element contains a compound having a relatively lower refractive index. The efficiency "100%" indicates a light emission efficiency of an organic light emitting element without a compound having a relatively lower refractive index, and "efficiency" in the graph of FIG. 4 indicates a relative value given based on 100%. Hereinafter, a compound exhibiting a low refractive index may be referred to as a "low refractive compound". In the graph of FIG. 4, the low refractive compound may be a compound represented by H1 and/or H2 below.

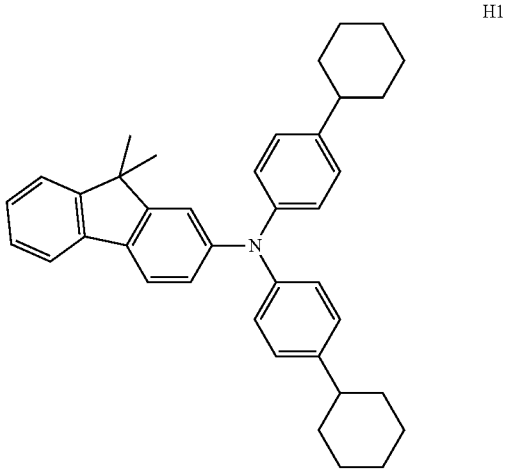

H1

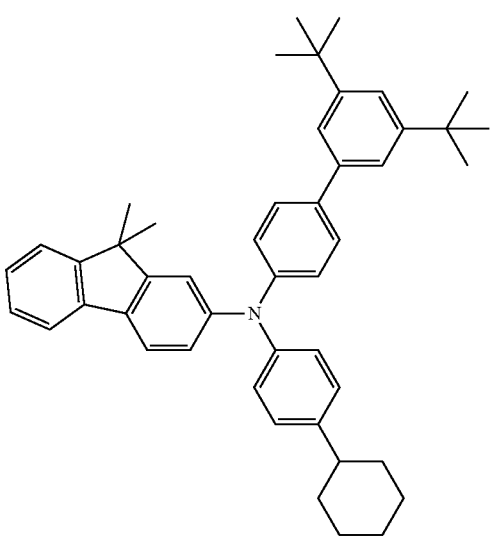

Referring to FIG. 4, it is seen that the light emission efficiency decreases when the low refractive compound is included in the first hole transport layer HTL1. For example, it is seen that the light emission efficiency decreases when a hole transport layer having a low refractive index among the three hole transport layers is disposed at the center and the other two hole transport layers having a high refractive index are disposed on both sides. For example, it is seen that excellent light emission efficiency is shown when the second hole transport layer HTL2, the third hole transport layer HTL3, the emission layer EML, or the electron transport layer ETL contains a low refractive compound. Accordingly, it is concluded that the organic light emitting elements 10 and 10a of an embodiment, in which the refractive index of the second hole transport layer HTL2, the refractive index of the third hole transport layer HTL3, the refractive index of the emission layer EML, and the refractive index of the electron transport layer ETL are lower than the refractive index of the first hole transport layer HTL1, may exhibit excellent light emission efficiency.

Figure 5:
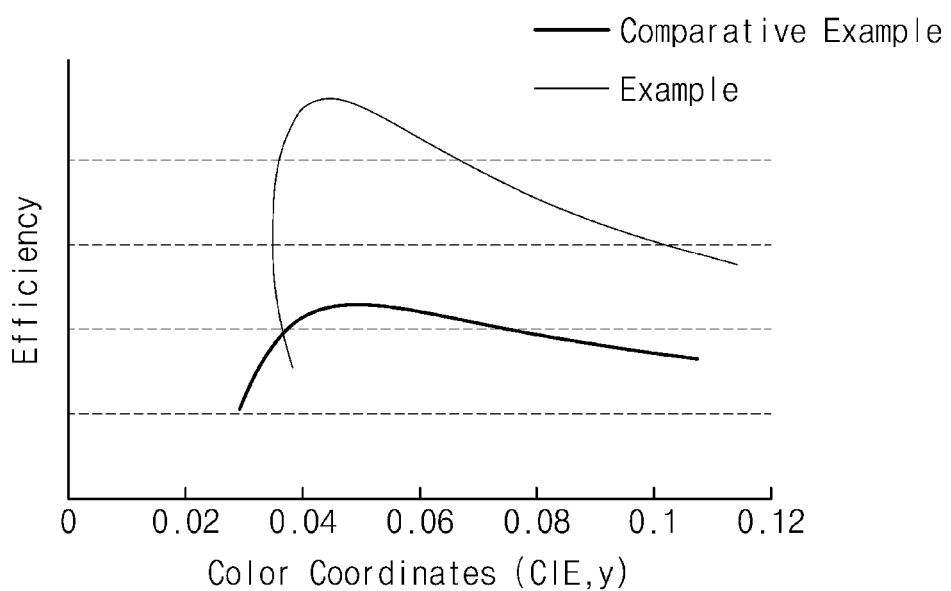
FIG. 5 is a graph showing light emission efficiency according to color coordinates.

FIG. 5 is a graph showing the light emission efficiency of organic light emitting elements of Comparative Examples and Examples according to color coordinates CIE (y). The color coordinates CIE (y) correspond to a "y" value of the color coordinates of light emitted from the organic light emitting elements of Comparative Examples and Examples. The organic light emitting elements of Comparative Examples and Examples have the same element configuration except for a hole transport layer, and the organic light emitting elements of Comparative Examples each include only one hole transport layer, and the organic light emitting elements of Examples each include first to third hole transport layers. The organic light emitting elements of Examples each are organic light emitting elements according to embodiments of the inventive concept. The organic light emitting elements of Comparative Examples do not include a low refractive compound, and the organic light emitting elements of Examples include a low refractive compound in the second hole transport layer, the third hole transport layer, the emission layer, and the electron transport layer, and the second hole transport layer, the third hole transport layer, the emission layer, and the electron transport layer may all have a refractive index of about 1.4.

Referring to the graph of FIG. 5, it is seen that, in the range of the color coordinate value of about 0.45 to about 0.55, the efficiency of the organic light emitting elements of Examples increases compared to the organic light emitting elements of Comparative Examples. The organic light emitting elements of Examples exhibited a 205% improvement in light emission efficiency compared to the organic light emitting elements of Comparative Examples. It is concluded that, unlike the organic light emitting elements of Comparative Examples without having a low refractive compound, the organic light emitting elements of Examples include a low refractive compound in the second hole transport layer, the third hole transport layer, the emission layer, and the electron transport layer, thereby having improved light emission efficiency.

The organic light emitting element according to an embodiment includes three hole transport layers, and may show that the refractive index of the two hole transport layers disposed on both sides each are lower than the refractive index of one hole transport layer disposed at the center. The refractive index of the first hole transport layer disposed at the center may be greater than the refractive index of the second hole transport layer and greater than the refractive index of the third hole transport layer, which are disposed on both sides. The organic light emitting element may include an emission layer and an electron transport layer having a lower refractive index than an adjacent functional layer. The organic light emitting element of an embodiment includes a structure in which layers including a material exhibiting low refractive properties and layers including a material exhibiting high refractive properties are alternately stacked, and thus light reflection due to a difference in refractive index between functional layers may increase, thereby having improved light emission efficiency.

An organic light emitting element of an embodiment includes functional layers having a low refractive index, and may thus exhibit improved light emission efficiency.

Although the inventive concept has been described with reference to embodiments of the inventive concept, it will be understood that the inventive concept should not be limited to these embodiments but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the claims.

What is claimed is:
1. An organic light emitting element comprising:
a first electrode;
a hole transport region disposed on the first electrode;
an emission layer disposed on the hole transport region;
an electron transport region disposed on the emission layer, the electron transport region including an electron transport layer; and
a second electrode disposed on the electron transport region, wherein
the hole transport region comprises:
  a first hole transport layer having a first refractive index;
  a second hole transport layer disposed above the first hole transport layer, the second hole transport layer having a second refractive index less than the first refractive index; and a third hole transport layer disposed below the first hole transport layer, the third hole transport layer having a third refractive index less than the first refractive index, a difference between the first refractive index and the second refractive index is in a range of about 0.1 to about 1.0, and a difference between the first refractive index and the third refractive index is in a range of about 0.1 to about 1.0.

2. The organic light emitting element of claim 1, wherein the hole transport region further comprises an electron blocking layer disposed between the second hole transport layer and the emission layer, and the electron blocking layer has a refractive index greater than the refractive index of the emission layer and greater than the second refractive index.

3. The organic light emitting element of claim 1, wherein a thickness of the second hole transport layer and a thickness of the third hole transport layer are each in a range of about 30% to about 40% of a total thickness of the first to third hole transport layers.

4. The organic light emitting element of claim 1, wherein a thickness ratio of the second hole transport layer, the first hole transport layer, and the third hole transport layer is in a range of about 3:4:3 to about 4:2:4.

5. The organic light emitting element of claim 1, wherein a thickness of the second hole transport layer and a thickness of the third hole transport layer are each in a range of about 10 nm to about 100 nm.

6. The organic light emitting element of claim 1, wherein the second refractive index and the third refractive index are each in a range of about 1.2 to about 1.7.

7. The organic light emitting element of claim 1, wherein the first refractive index is in a range of about 1.7 to about 2.2.

8. The organic light emitting element of claim 1, wherein the third hole transport layer is directly disposed on the first electrode, and the third refractive index and the refractive index of the emission layer are the same.

9. The organic light emitting element of claim 1, wherein the second hole transport layer and the third hole transport layer each independently comprise an aromatic compound represented by one of Formulas 1 to 4:

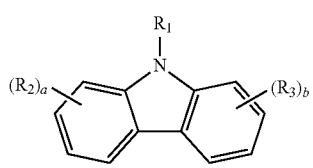
[Formula 1]

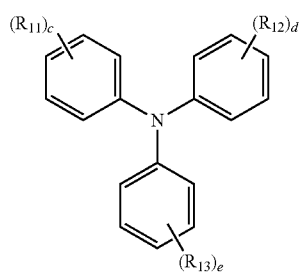
[Formula 2]

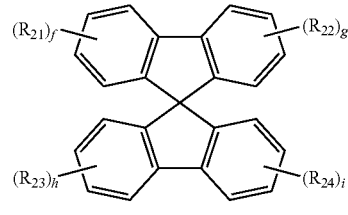
[Formula 3]

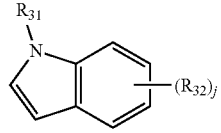
[Formula 4]

wherein in Formulas 1 to 4, a, b, and f to j are each independently an integer from 1 to 4, c to e are each independently an integer of 1 to 5, $R_1$ to $R_3$, $R_{11}$ to $R_{13}$, $R_{21}$ to $R_{24}$, $R_{31}$, and $R_{32}$ are each independently a hydrogen atom, a deuterium atom, a halogen atom, a substituted or unsubstituted alkyl group having 1 to 30 carbon atoms, a substituted or unsubstituted cycloalkyl group having 3 to 30 carbon atoms, or a substituted or unsubstituted aryl group having 6 to 30 ring-forming carbon atoms, or bonded to an adjacent group to form a ring, and at least one among $R_1$ to $R_3$, at least one among $R_{11}$ to $R_{13}$, at least one among $R_{21}$ to $R_{24}$, and at least one of $R_{31}$ and $R_{32}$ are each independently a substituted or unsubstituted alkyl group having 1 to 30 carbon atoms, or a substituted or unsubstituted cycloalkyl group having 3 to 30 carbon atoms.

10. The organic light emitting element of claim 9, wherein at least one among $R_{11}$ to $R_{13}$ is a substituted or unsubstituted alkyl group having 1 to 10 carbon atoms, or a substituted or unsubstituted cycloalkyl group having 3 to 10 carbon atoms.

11. The organic light emitting element of claim 9, wherein the emission layer and the electron transport layer each comprise the aromatic compound represented by one of Formulas 1 to 4.

12. The organic light emitting element of claim 1, wherein a refractive index of the emission layer and a refractive index of the electron transport layer are each less than the first refractive index.

13. The organic light emitting element of claim 1, wherein the electron transport region further comprises a hole blocking layer disposed on the emission layer, and a refractive index of the emission layer and a refractive index of the electron transport layer are each less than the refractive index of the hole blocking layer.

14. The organic light emitting element of claim 13, wherein a difference between the refractive index of the hole blocking layer and the refractive index of the emission layer is in a range of about 0.1 to about 1.0, and a difference between the refractive index of the hole blocking layer and the refractive index of the electron transport layer is in a range of about 0.1 to about 1.0.

15. The organic light emitting element of claim 1, further comprising a hole injection layer disposed between the first electrode and the first hole transport layer, wherein the refractive index of the hole injection layer is less than the first refractive index.

16. The organic light emitting element of claim 1, wherein a refractive index of the emission layer and a refractive index of the electron transport layer are each in a range of about 1.2 to about 1.7.

17. An organic light emitting element comprising:
a first electrode;
a plurality of hole transport layers disposed on the first electrode;
an emission layer disposed on the plurality of hole transport layers;
a hole blocking layer disposed on the emission layer;
an electron transport layer disposed on the hole blocking layer; and
a second electrode disposed on the electron transport layer, wherein
the plurality of hole transport layers comprise:
a first hole transport layer having a first refractive index;
a second hole transport layer disposed between the emission layer and the first hole transport layer, the second hole transport layer having a second refractive index less than the first refractive index; and
a third hole transport layer disposed between the first hole transport layer and the first electrode, the third hole transport layer having a third refractive index less than the first refractive index,
the second refractive index, the third refractive index, a refractive index of the emission layer, and a refractive index of the electron transport layer are each in a range of about 1.2 to about 1.7,
the first refractive index and a refractive index of the hole blocking layer are each in a range of about 1.7 to about 2.2, and
the second refractive index, the third refractive index, the refractive index of the emission layer, and the refractive index of the electron transport layer are each less than the first refractive index.

18. The organic light emitting element of claim 17, wherein
a difference between the first refractive index and the second refractive index is in a range of about 0.1 to about 1.0, and
a difference between the first refractive index and the third refractive index is in a range of about 0.1 to about 1.0.

19. The organic light emitting element of claim 17, wherein the second refractive index, the third refractive index, the refractive index of the emission layer, and the refractive index of the electron transport layer are the same.

20. The organic light emitting element of claim 17, wherein the second hole transport layer, the third hole transport layer, the emission layer, and the electron transport layer each independently comprise an aromatic compound represented by any of among Formulas 1 to 4:

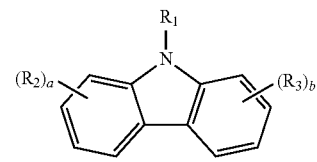
[Formula 1]

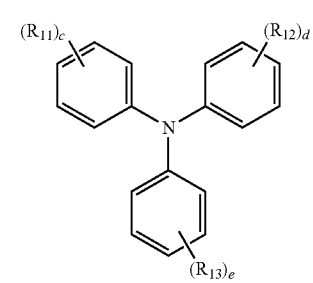
[Formula 2]

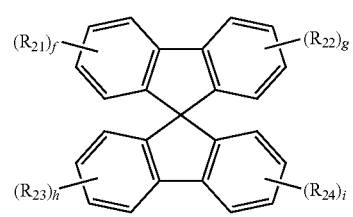
[Formula 3]

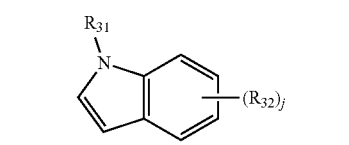
[Formula 4]

wherein in Formulas 1 to 4,
a, b, and f to j are each independently an integer from 1 to 4,
c to e are each independently an integer from 1 to 5,
$R_1$ to $R_3$, $R_{11}$ to $R_{13}$, $R_{21}$ to $R_{24}$, $R_{31}$, and $R_{32}$ are each independently a hydrogen atom, a deuterium atom, a halogen atom, a substituted or unsubstituted alkyl group having 1 to 30 carbon atoms, a substituted or unsubstituted cycloalkyl group having 3 to 30 carbon atoms, or a substituted or unsubstituted aryl group having 6 to 30 ring-forming carbon atoms, or bonded to an adjacent group to form a ring, and
at least one among $R_1$ to $R_3$, at least one among $R_{11}$ to $R_{13}$, at least one among $R_{21}$ to $R_{24}$, and at least one of $R_{31}$ or $R_{32}$ are each independently a substituted or unsubstituted alkyl group having 1 to 30 carbon atoms, or a substituted or unsubstituted cycloalkyl group having 3 to 30 carbon atoms.

* * * * *